(12) United States Patent
Nagata et al.

(10) Patent No.: US 6,690,614 B2
(45) Date of Patent: Feb. 10, 2004

(54) SEMICONDUCTOR INTEGRATED CIRCUIT DEVICE

(75) Inventors: Shinya Nagata, Hyogo (JP);
Katsuyoshi Watanabe, Hyogo (JP);
Masahiko Ikemoto, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/212,789

(22) Filed: Aug. 7, 2002

(65) Prior Publication Data

US 2003/0058729 A1 Mar. 27, 2003

(30) Foreign Application Priority Data

Sep. 21, 2001 (JP) .................................... 2001-288792

(51) Int. Cl.[7] .................................................. G11C 8/00
(52) U.S. Cl. .................. 365/230.03; 365/51; 365/63
(58) Field of Search ......................... 365/230.03, 51, 365/63; 257/207, 208

(56) References Cited

U.S. PATENT DOCUMENTS 5,453,583 A  *  9/1995  Rostoker et al. ............. 174/267
6,069,812 A  *  5/2000  Lee et al. ...................... 365/51
6,469,327 B1  *  10/2002  Yasuda et al. ............... 257/207

FOREIGN PATENT DOCUMENTS

JP          62-212860          9/1987
JP          8-023267           1/1996

* cited by examiner

*Primary Examiner*—Richard Elms
*Assistant Examiner*—Anh Phung
(74) *Attorney, Agent, or Firm*—Burns, Doane, Swecker & Mathis, LLP

(57) ABSTRACT

A semiconductor chip is divided into a first semiconductor region surrounded by pads and a region outside the pads. A memory is arranged at the region outside the pads. A memory arranged in the first semiconductor region and the memory arranged outside the pads are coupled to a bus interface unit via separate memory buses and a selector. The selector is driven by two phase, non-overlapping clock signals. A semiconductor integrated circuit device is provided that can easily accommodate for modification in the memory capacity of the memory and that can transfer signal/data at high speed with a low power consumption, irrespective of modification in bus interconnection length.

14 Claims, 13 Drawing Sheets

SEMICONDUCTOR INTEGRATED CIRCUIT DEVICE

BACKGROUND OF THE INVENTION

1. Field of the Invention

The present invention relates to semiconductor integrated circuit devices, particularly to the layout of a semiconductor integrated circuit device on a semiconductor chip. More particularly, the present invention relates to the layout of a memory device on a chip, and to the bus arrangement and signal transfer timing with respect to the memory device.

2. Description of the Background Art

FIG. 25 is a schematic diagram of an entire structure of a conventional semiconductor integrated circuit device. Referring to FIG. 25, the conventional semiconductor integrated circuit device includes a plurality of bonding pads 1 arranged along the periphery of a semiconductor chip CH, and an internal circuitry region 2 defined by these bonding pads 1. Bonding pads 1 are arranged enclosing internal circuitry region 2 along the four sides of semiconductor chip CH. Bonding pad 1 is electrically connected to an external lead terminal via a bonding wire (not shown), and is electrically coupled with an external device.

In internal circuitry region 2, there are arranged a central processing unit (CPU) 3 executing operational processing, a ROM (read only memory) 4 storing data/instructions required by CPU 3, a RAM (random access memory) 5 storing the data/instruction used by CPU 3, and also serving as a working area of CPU 3 to temporarily store data, and peripheral functions 6 and 7 including an input/output interface, a timer, an asynchronous receiver transmitter unit (UART) and others. Peripheral function 6 is disposed adjacent to CPU 3. Peripheral function 7 is disposed between ROM 4 and RAM 5.

The semiconductor integrated circuit device of FIG. 25 is a so-called one-chip micro computer. By integrating CPU 3, ROM 4 and RAM 5 on a semiconductor chip CH, the bus line interconnecting these CPU 3, ROM 4 and RAM 5 can be formed by on-chip interconnection lines to shorten the length of the bus line, and signal/data can be transferred at high speed with low power consumption. Thus, high speed processing can be achieved with a small occupying area.

A bus line (not shown) between CPU 3, ROM 4 and RAM 5 is an on-chip interconnection line, and the bus width can be made wide enough to allow increase of the data bit width.

In the semiconductor integrated circuit device of FIG. 25, each component is arranged in internal circuitry region 2 with the layout optimized in order to increase the area usage efficiency for minimizing the chip area. In optimizing the arrangement of each component, the interconnection layout of the internal bus is similarly optimized.

In this semiconductor integrated circuit device, the memory capacity of RAM 4 and RAM 5 is set according to the processing contents. When the processing contents are complicated and the amount of processing data is great, the memory capacity of ROM 4 and/or RAM 5 must be increased.

FIG. 26 schematically shows the layout of a semiconductor memory device in the case in which the memory capacity of ROM 4 and RAM 5 is increased. Referring to FIG. 26, the memory capacity of ROM 14 and RAM 15 in internal circuitry region 2 is increased as compared with that of ROM 4 and RAM 5 shown in FIG. 25, and their respective occupying areas are increased. According to the increase of the area of ROM 14 and RAM 15, the layout is modified so as to minimize the area of semiconductor chip CH. Therefore, a peripheral function 17 between ROM 14 and RAM 15 and a peripheral function 16 adjacent to the CPU differ in internal layout from peripheral functions 7 and 6 in the semiconductor integrated circuit device shown in FIG. 25.

Accordingly, the layout of the interconnection lines from the components such as the UART included in these peripheral functions 16 and 17 to pads 1 differs, and the interconnection length is also changed.

As the interconnection line width and interconnection line pitch become smaller in accordance with the miniaturization of elements, the interconnection line capacitance and line resistance as well as the inter-line capacitance will be changed due to a change in interconnection route. Therefore, this change in interconnection route may accompany a circuit portion weak in immunity against a surge, where disconnection is caused when a surge voltage is generated, and the generated surge voltage is transmitted via the inter-line capacitance to exert an adverse effect on the circuit operation. Therefore, in the case where the memory capacity of such ROMs and/or RAMs is to be modified, the reliability of the semiconductor integrated circuit must be sufficiently re-evaluated from the beginning. This evaluation of a semiconductor integrated circuit device is time-consuming, resulting in increased cost.

The length of internal circuitry region 2 in the X direction and/or Y direction will increase in accordance with an increase of area of ROM 14 and RAM 15. Therefore, the coordinates of pads 1 arranged at the periphery of the chip will also differ. Generally a testing jig is employed for evaluating the reliability of a semiconductor integrated circuit device. This jig is electrically connected to the bonding pads (referred to as "pads" hereinafter) 1, and testing is carried out. When the coordinates of pads 1 are altered, the pad contact position of the jig must be modified according to the coordinates of pads 1 of the newly produced semiconductor integrated circuit device. This modification of the jig for re-evaluating semiconductor integrated circuit device requires much time and a great amount of labor, and also increases cost.

Moreover, when the chip area of the semiconductor integrated circuit device is increased to increase a bus line length between components as shown in FIG. 26, the propagation time of signal/data becomes longer. Therefore, in the case where the internal circuitry performs a processing in synchronization with a clock signal and the cycle time of the processing is determined by the clock signal, when the timing between internal control signals and transferred signal/data is deviated, sufficient set up/hold time cannot be ensured and a signal of an intermediate voltage level may be transferred.

If a signal line is maintained at the level of an intermediate potential, through current disadvantageously flows at the next stage circuit, to increase power consumption. Furthermore, data cannot be properly transferred. Particularly, in the case where the next stage circuit is constituted by an MOS transistor (insulated gate type field effect transistor), such a through current would degrade the low power consumption performance which is the feature of an MOS circuit. There is also a possibility of erroneous operation since the next stage circuit cannot be operated properly due to the signal of the intermediate voltage level.

SUMMARY OF THE INVENTION

An object of the present invention is to provide a semiconductor integrated circuit device that can suppress layout modification to a minimum when the memory capacity of a memory device is modified.

Another object of the present invention is to provide a semiconductor integrated circuit device that can transfer signal/data at high speed even in the case where the bus line length is increased by layout modification.

A further object of the present invention is to provide a semiconductor integrated circuit device that can transfer signal/data properly at high speed and at low power consumption even in the case where the bus line length is changed by layout modification.

Briefly stated, according to the present invention, a semiconductor chip is divided into a first semiconductor region defined by pads, and a second region outside these pads. At least a part of an ROM and/or RAM is arranged in the second semiconductor region.

Specifically, according to an aspect of the present invention, a semiconductor integrated circuit device includes a first semiconductor region where internal circuitry including a processor is arranged, a second semiconductor region where a first memory device is arranged, and pads arranged between the first and second semiconductor regions.

According to another aspect of the present invention, a semiconductor integrated circuit device includes a processor, first and second memory devices, a select signal generation circuit generating a memory select signal specifying the first and second memory devices according to a memory address signal from the processor, and transmitting the generated memory select signal in synchronization with a first clock signal, a select circuit coupling to an internal bus a memory device specified by the memory select signal out of the first and second memory devices in response to the memory select signal, and a transfer circuit transferring data from the processor to the select circuit via the internal bus in synchronization with a second clock signal complementary to the first clock signal.

By arranging pads between the first and second semiconductor regions and disposing the first memory device in the second semiconductor region, the layout of the first semiconductor region is substantially fixed whereas the layout of the first memory device in the second semiconductor region is modified according to the memory capacity. The layout of the internal circuitry as well as the layout of the internal lines are not changed. Therefore, the characteristics of the internal circuitry can be ensured. Only the labor for modifying the layout of the first memory device and testing thereof is required. Since the coordinates of the pads are not changed, a conventional jig can be used to test the semiconductor integrated circuit device. In the test program, only the address region has to be modified according to the memory capacity of the first memory device. Thus, modification of the memory capacity of a memory device can be easily accommodated for.

Control of the select circuit and data transfer are effected in synchronization with clock signals complementary to each other. Data can be reliably transferred after a select circuit enters a selected state. Therefore, data of a definite state can be reliably transferred to a next stage memory device. Since only the selected memory device is coupled to the memory data bus, the load on the bus is reduced to allow high speed data transfer.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
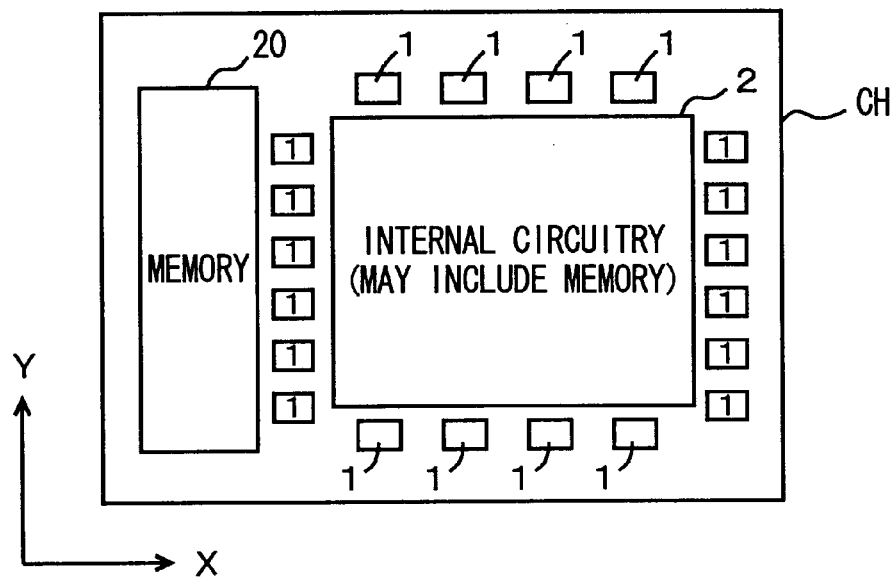
FIGS. 1 and 2 schematically show the layout of a semiconductor integrated circuit device on a chip according to a first embodiment and a second embodiment, respectively, of the present invention.
Figure 25:
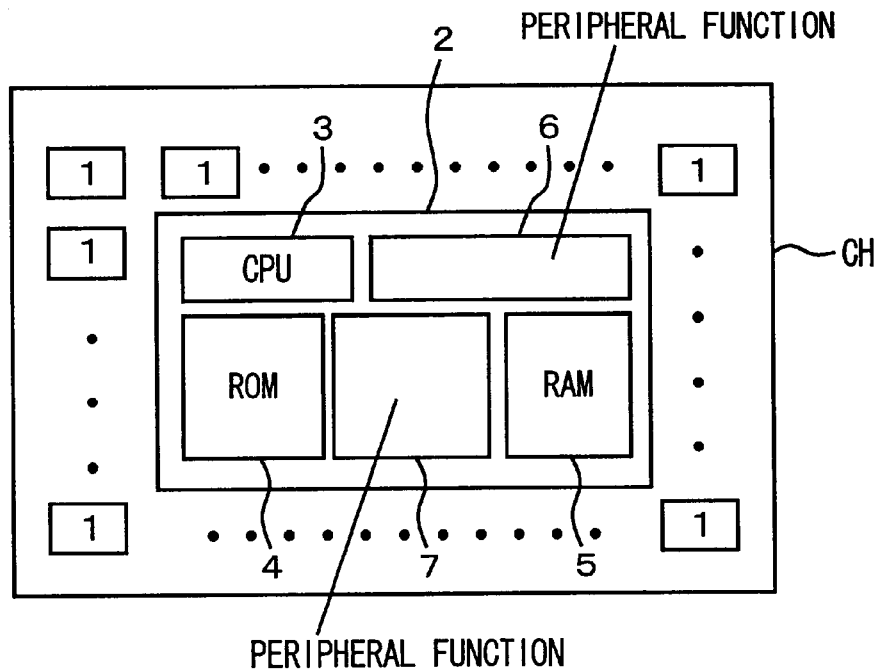
FIG. 25 schematically shows an entire structure of a conventional semiconductor integrated circuit device.
Figure 26:
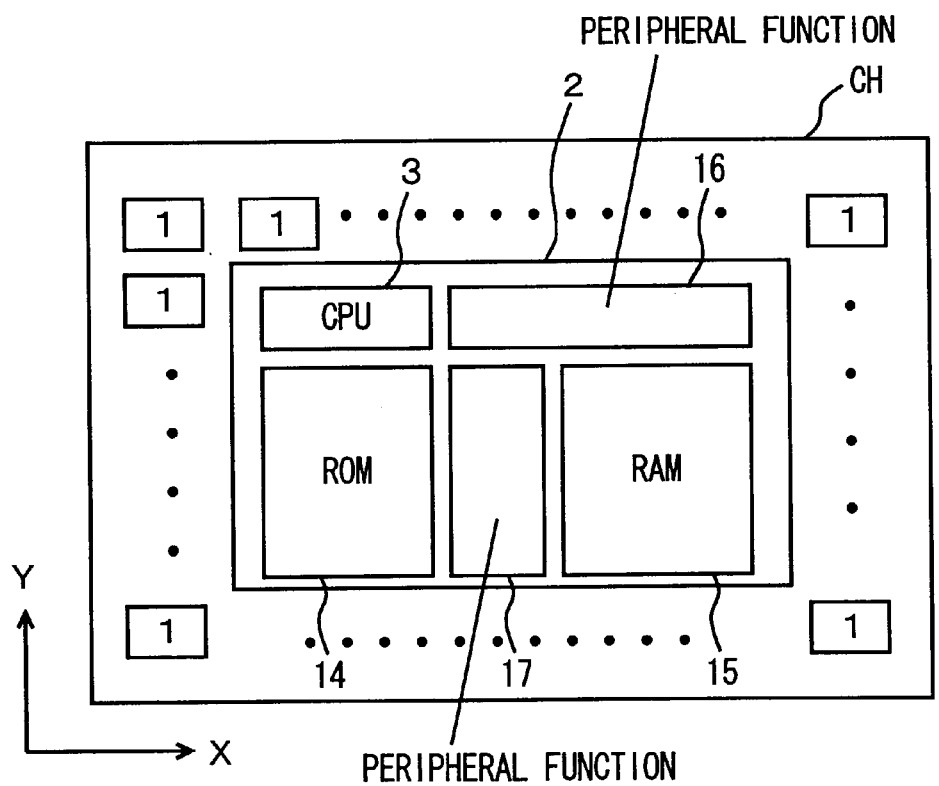
FIG. 26 schematically shows the layout of a conventional semiconductor integrated circuit device when the memory capacity is changed.

FIG. 1 schematically shows an entire structure of a semiconductor integrated circuit device according to a first embodiment of the present invention. In FIG. 1, the semiconductor integrated circuit device is integrated on a semiconductor chip CH. Semiconductor chip CH includes an internal circuitry region 2 surrounded by pads 1, and a memory 20 arranged outside pads 1. The internal circuitry arranged in internal circuitry region 2 includes a CPU 3 and peripheral functions 6 and 7 (16 and 17) as shown in FIG. 25. The internal circuitry disposed in internal circuitry region 2 may include a part of a ROM and/or a RAM.

Memory 20 disposed outside pads 1 includes a ROM and/or a RAM. In this semiconductor integrated circuit device, the memory capacity of the ROM and/or RAM constituting memory 20 is increased when the memory capacity of the memory is to be increased. The layout of internal circuitry region 2 remains unchanged. The arranged positions (coordinates) of pads 1 disposed surrounding internal circuitry 2 are also kept unchanged.

In the case where the memory capacity of memory 20 is to be altered, the area of memory 20 along the X direction in FIG. 1 is increased or decreased to increase or decrease the memory capacity of memory 20. As to the Y direction, the length of memory 20 is not changed. By altering the area of memory 20 only in this one direction, the memory capacity of memory 20 can be altered without modifying the coordinates of pad 1.

Therefore, in the case where the storage capacity of the ROM and/or RAM is to be altered, the memory capacity of memory 20 located outside pads 1 is increased with only the layout of memory 20 altered. The arrangement of internal circuitry arranged in internal circuitry region 2 and pads 1 remains unchanged. Once the evaluation of the circuit characteristics and reliability of the internal circuitry arranged in internal circuitry region 2 is established, the evaluation result can be applied to the cases of various memory capacities of memory 20. Therefore, only an evaluation of memory 20 is required for the evaluation of the semiconductor integrated circuit device, and the time required for the evaluation can be reduced.

Upon modification of the layout, the layout of memory 20 in the X direction has only to be altered. The labor required for modifying the layout when the memory capacity is altered can be alleviated.

By repeatedly arranging a plurality of basic memory units in the X direction to construct memory 20, increase/decrease of the memory capacity of memory 20 can easily be accommodated for.

Since the coordinates of pads 1 remain unchanged, the testing jig does not have to be modified even if the memory capacity of memory 20 is altered. Thus, the reliability evaluation can be effected using a conventional reliability evaluation tester.

By registering the configuration including the layout of pads 1 and internal circuitry region 2 in a library form as one macro, a semiconductor integrated circuit device can be produced in a macro-based manner. As for memory 20, when the basic memory unit is in a macro form, the required memory capacity of memory 20 can be achieved by increasing/decreasing the number of basic memory units when the memory capacity of memory 20 is to be increased/decreased. Thus, increase/decrease of the memory capacity can be accommodated for readily.

As described so far, according to the first embodiment of the present invention, the memory (ROM and/or RAM) is arranged outside the pads. Therefore, the labor on layout modification can be minimized in the case when the memory capacity of the memory device is to be increased/decreased. The configuration of the internal circuitry region remains unchanged, and therefore, the time required for reliability evaluation can be reduced.

Second Embodiment

Figure 2:
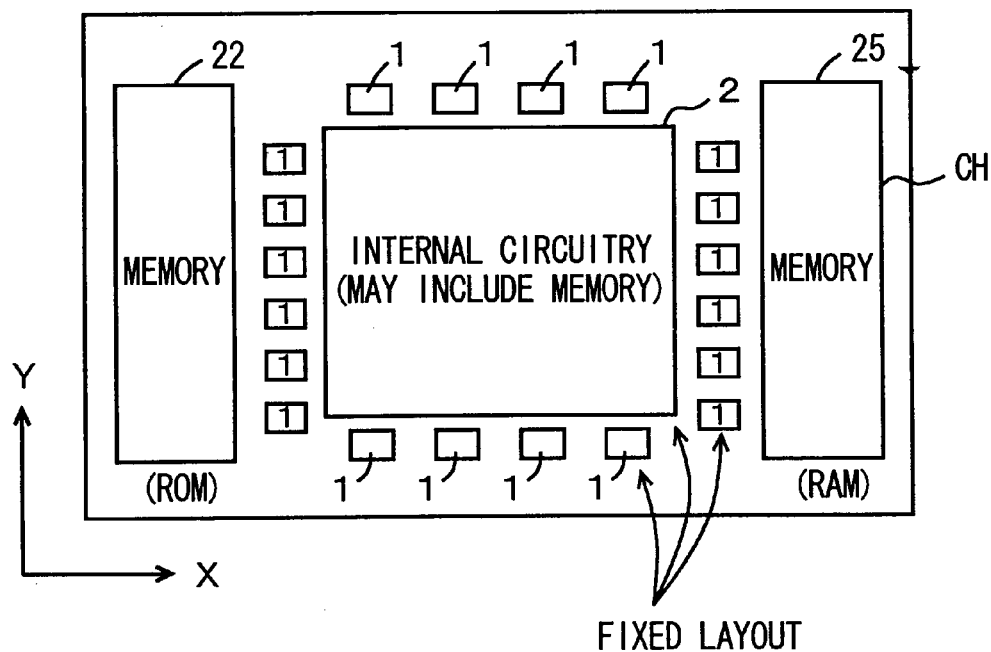

FIG. 2 schematically shows an entire structure of a semiconductor integrated circuit device according to a second embodiment of the present invention. Referring to FIG. 2, the semiconductor integrated circuit device includes memories 22 and 25 disposed on chip CH at the outer side of pads 1 in the X direction with internal circuitry region 2 arranged in between.

The layout of internal circuitry in internal circuitry region 2 and pads 1 remains unchanged, irrespective of change in the memory capacity of memories 22 and 25. Memories 22 and 25 differ in their types. For example, memory 22 is a ROM whereas memory 25 is a RAM. In the case where memories 22 and 25 of different types are arranged at the outer side of the pads 1 with internal circuitry region 2 arranged in between and the memory capacity of these memories 22 and 25 is to be increased/decreased, the area of memories 22 and 25 is altered along the X direction to modify the memory capacity.

For example, when memory 22 is a ROM and memory 25 is RAM, the memory capacity thereof can be increased/reduced by increasing/decreasing the number of corresponding basic memory units.

Since memories 22 and 25 differ in type, the layout regularity differs from each other. Specifically, the type of the repeating circuit differs between memories 22 and 25. Here, "repeating circuit" is the circuit repeatedly arranged with the same layout pattern, and refers to, for example, a row decoder, a sense amplifier in a DRAM (dynamic random access memory), or the like. The occupying area of memories 22 and 25 also differs from each other.

When such memories 22 and 25 are disposed at one outer side of pads 1 along the X direction on semiconductor chip CH, there will be an empty region due to the difference in the ratio of the memory capacity and in the layout regularity of memories 22 and 25. Thus, the area usage efficiency may be degraded. By disposing memories 22 and 25 at both sides of pads 1 in the X direction, the layout of each of memories 22 and 25 can be optimized at respective regions. Accordingly, the chip area can be minimized without degradation in area usage efficiency.

In each region, the basic memory block is to be simply increased/decreased along the X direction. Therefore, modification in the memory capacity of memories 22 and 25 can be readily accommodated for. As in the first embodiment, the layout of the internal circuitry in internal circuitry region 2 and pads 1 remain unchanged. Therefore, the reliability evaluation thereof can be applied to a semiconductor integrated circuit device having a different memory capacity, and the time required for evaluation can be reduced.

Memories 22 and 25 are any, as long as they are of different types. One may be an SRAM (static random access memory) and the other may be a DRAM.

Third Embodiment

Figure 3:
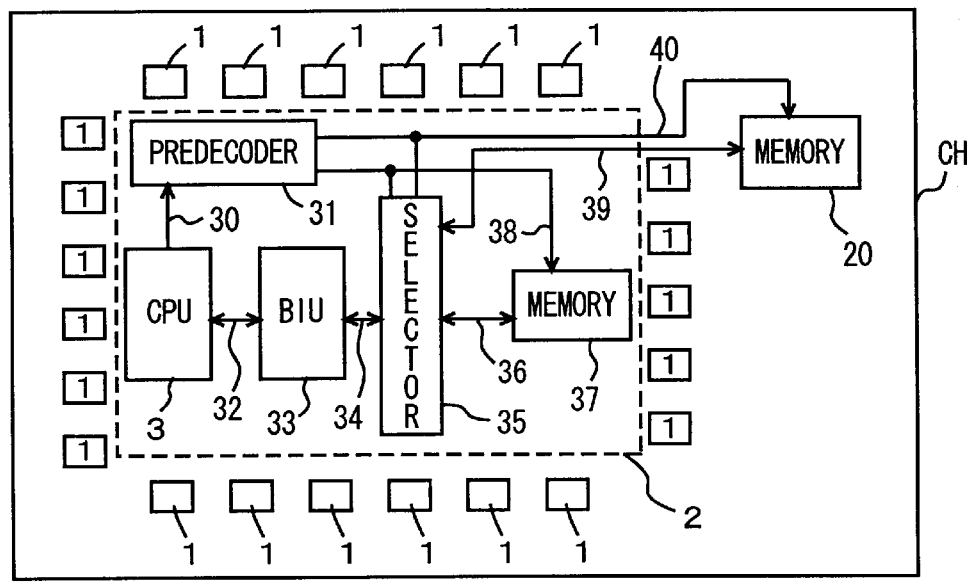
FIG. 3 schematically shows an entire structure of a semiconductor integrated circuit device according to a third embodiment of the present invention.

FIG. 3 schematically shows a structure of a main part of a semiconductor integrated circuit device according to a third embodiment of the present invention. Referring to FIG. 3, a memory 37 is disposed in internal circuitry region 2. Memory 20 is disposed at an external region opposite to internal circuitry region 2 with respective to pads 1. Each of memories 20 and 37 is a ROM and/or a RAM. Memories 20 and 37 may be memories of the same type or of different types. Memories 20 and 37 may include both ROM and RAM.

In internal circuitry region 2, there are provided a predecoder 31 for predecoding a memory address signal applied from CPU 3 via an address bus 30 to send out the predecode signal specifying a memory onto decode buses 38 and 40, a bus interface unit (BIU) 33 coupled to CPU 3 via internal bus 32 to output an address signal and a control signal to bus 34 at a predetermined timing in the access to memory 37 or 24, and to output write data in a data writing mode according to the address, data and control signal from CPU 3, and a selector 35 connecting bus 34 to one of memory buses 36 and 39 according to the predecode signal from predecoder 31.

Here, "bus" includes a control bus transmitting a control signal, an address bus transmitting an address signal, and a data bus transmitting data.

Memory bus 36 is coupled to memory 37 whereas memory bus 39 is coupled to memory 20. These memory buses 36 and 39 include the bus to transfer an address signal, control signal, and data.

Memories 20 and 37 may include a plurality of blocks and the memory and the memory block may be specified by the predecode signal from predecoder 31.

In the case where CPU 30 accesses one of memories 37 and 20, selector 35 couples one of memory buses 36 and 39 to internal bus 34. The operation of the semiconductor integrated circuit device shown in FIG. 3 will be described briefly below.

In the case where CPU 3 executes an instruction that requires memory access such as a load or store instruction, the memory address signal specifying the memory that is to be accessed is applied to predecoder 31 via address bus 30, and the address signal addressing an access target and the data in data writing are transmitted to bus interface unit (referred to as BIU hereinafter) 33 via internal bus 32.

Selector 35, responsive to the predecode signal applied onto control bus 38 and 40 from predecoder 31, couples memory bus 36 or 39 provided corresponding to the memory of an access target to internal bus 34. BIU 33 transmits the address signal, the control signal and the data in data writing supplied from CPU 3 via selector 35 at a predetermined timing onto the memory bus provided corresponding to the selected memory.

In reading data from the memory, the data read out from the selected memory is transmitted onto internal bus 34 via selector 35. BIU 33 takes in the data on internal bus 34 in a data read mode, and transfers the received data to CPU 3 via internal bus 32 at a predetermined timing.

According to the construction of the semiconductor integrated circuit device shown in FIG. 3, memories 20 and 37 are coupled to separate memory buses 39 and 36. Selector 35 couples the memory bus provided corresponding to the memory to be accessed (memory block) to internal bus 30. Therefore, during the access to the memory, only one of memory buses 36 and 39 is coupled to internal bus 34. The load on internal bus 34 is alleviated, as compared to the case where memories 37 and 20 are connected in common to internal bus 34. Thus, the data/signal can be transferred at high speed.

In the case where memory 20 is disposed at a region outside pads 1 and the bus line may become longer, only one of memory buses 36 and 39 is connected to internal bus 34. Therefore, the load on internal bus 34 can be alleviated to achieve transfer of a signal/data at high speed. Since the load on internal bus 34 is alleviated, the parasitic capacitance is reduced. Therefore, charging/discharging current of the line capacitance of the bus is reduced, to reduce power consumption.

In other words, the load on the bus will become greater when memories 20 and 37 are connected to a common memory bus, which in turn is coupled to BIU 33. Therefore, the charging period of time of the bus signal line will become longer as indicated by the broken line in FIG. 4. However, the bus load can be alleviated by coupling memories 20 and 37 to different memory buses 31 and 36, respectively, and by selectively coupling the memory bus connected to the memory of an access target to internal bus 34 by selector 35. Consequently, the rising of the charging voltage of the bus signal line becomes faster as indicated by the solid line in FIG. 4.

Figure 4:
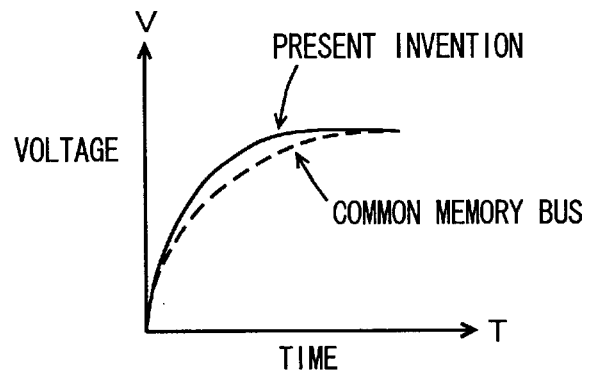
FIG. 4 schematically shows the signal propagation characteristics of the circuit arrangement of FIG. 3.

FIG. 4 shows the voltage change for one bus signal line of memory buses 39 and 36. In FIG. 4, time T reads along the abscissas whereas voltage V reads along the ordinate.

By providing a memory bus for each memory, the bus load can be alleviated. The time for discharging is shortened at the fall of the signal/data of the bus signal line, to allow the signal to be pulled down at high speed, similarly. Thus, high speed data transfer can be achieved.

In the case where memory 20 is disposed at a region outside pads 1 on the chip, the interconnection length of memory bus 39 will be increased to increase the bus load with some possibility. The provision of separate buses for these memories can alleviate the interconnection load to achieve data transfer at high speed. Since the bus load (interconnection line capacitance) is alleviated, the charging and discharging current is reduced. Accordingly, power dissipation can be reduced.

Structure 1 of Selector 35

Figure 5:
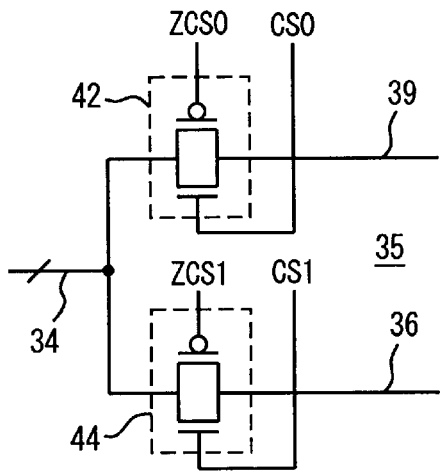
FIG. 5 shows an example of a structure of the selector of FIG. 3.

FIG. 5 shows a structure of selector 35 of FIG. 3. Referring to FIG. 5, selector 35 includes a transmission gate 42 selectively rendered conductive according to complementary predecode signals ZCS0 and CS0 from predecoder 31 and connecting internal bus 34 and memory bus 39 when conductive, and a transmission gate 44 selectively rendered conductive according to complementary predecode signals ZCS1 and CS1 from predecoder 31, and coupling internal bus 34 and memory bus 36 when conductive.

Complementary predecode signals ZCS0 and CS0 designate memory 20 when active. Complementary predecode signals ZCS 1 and CS1 designate memory 37 when active.

These transmission gates 42 and 44 merely electrically couple internal bus 34 with memory bus 39 or 36 when conductive. By using transmission gates for selector 35 in the case where internal bus 30 and memory bus 39 are bidirectional buses, the bidirectional buses can be connected to each other without increasing the circuit occupying area.

These transmission gates 42 and 44 each ensure the electrical isolation of internal bus 34 from the corresponding memory bus in a nonconductive state. When transmission gates 42 and 44 are nonconductive, only the parasitic capacitance of these transmission gates 42 and 44 is connected to internal bus 34. The memory bus arranged corresponding to the non-selected memory can be reliably isolated from bus 34. Thus, the effective parasitic capacitance of bus 34 can be reduced.

Each of transmission gates 42 and 44 includes a CMOS transmission gate circuit arranged corresponding to respective corresponding bus signal lines to electrically couple the signal/data line of bus 34 with the signal/data line of the corresponding memory bus in a conductive state.

Structure 2 of Selector

Figure 6:
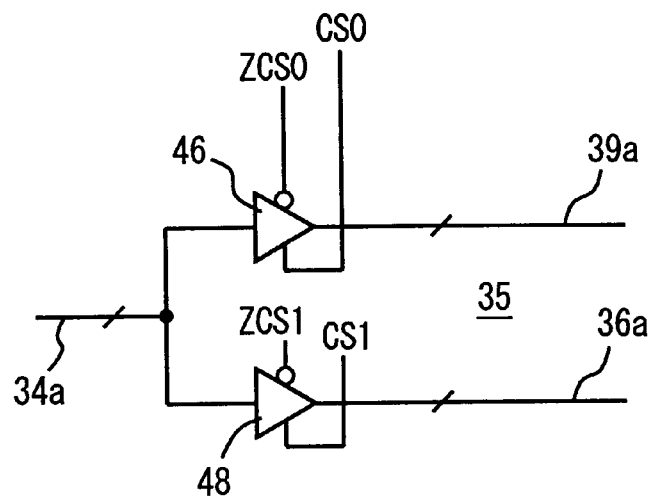
FIG. 6 shows a modification of the selector of FIG. 3.

FIG. 6 shows another structure of selector 35. In FIG. 6, selector 35 is provided for internal bus 34 and memory buses 36 and 39 which are unidirectional buses. Specifically, the address signal and control signal are transmitted unidirectionally in one direction from BJU 33 to memories 37 and 20. These address buses and control buses are indicated as buses 34a, 36a and 39a in FIG. 6.

Referring to FIG. 6, selector 35 includes a tristate buffer circuit 46 selectively rendered active according to complementary predecode signals CS0 and ZCS0 from predecoder 31 and transmitting the signal on internal bus 34a onto memory bus 39a when active, and a tristate buffer circuit 48 rendered active when complementary predecode signals CS1 and ZCS1 from predecoder 31 are active and transmitting the signal on internal bus 34a onto memory bus 36a when active.

Predecode signals CS0 and ZCS0 designate memory 20 when active. Predecode signals CS1 and ZCS1 designate memory 37 when active. Memory buses 39a and 36a are the address and control buses included in buses 39 and 36, respectively. Internal bus 34a includes the address bus and control bus included in internal bus 34.

According to the structure shown in FIG. 6, tristate buffer circuits 46 and 48 are selectively rendered active according to a selected memory. Tristate buffer circuits 46 and 48 enter an output high impedance state when inactive. Memory buses 39a and 36a are isolated from internal bus 34a when corresponding tristate buffer circuits 46 and 48 enter an output high impedance state.

Each of tristate buffer circuits 46 and 48 includes a tristate buffer provided corresponding to each bus signal line. These tristate buffers are formed of, for example, a CMOS circuit. According to this structure, only the gate capacitance of the tristate buffers of tristate buffer circuits 46 and 48 is constantly connected to internal bus 34a, and the load of the bus is significantly reduced, as compared to the case where memories 37 and 20 are coupled in common to internal bus 34e.

Tristate buffer circuits 46 and 48 drive the corresponding memory buses 39a and 36a when active to drive memory buses 39a and 36a to achieve high speed signal transfer.

Figure 7:
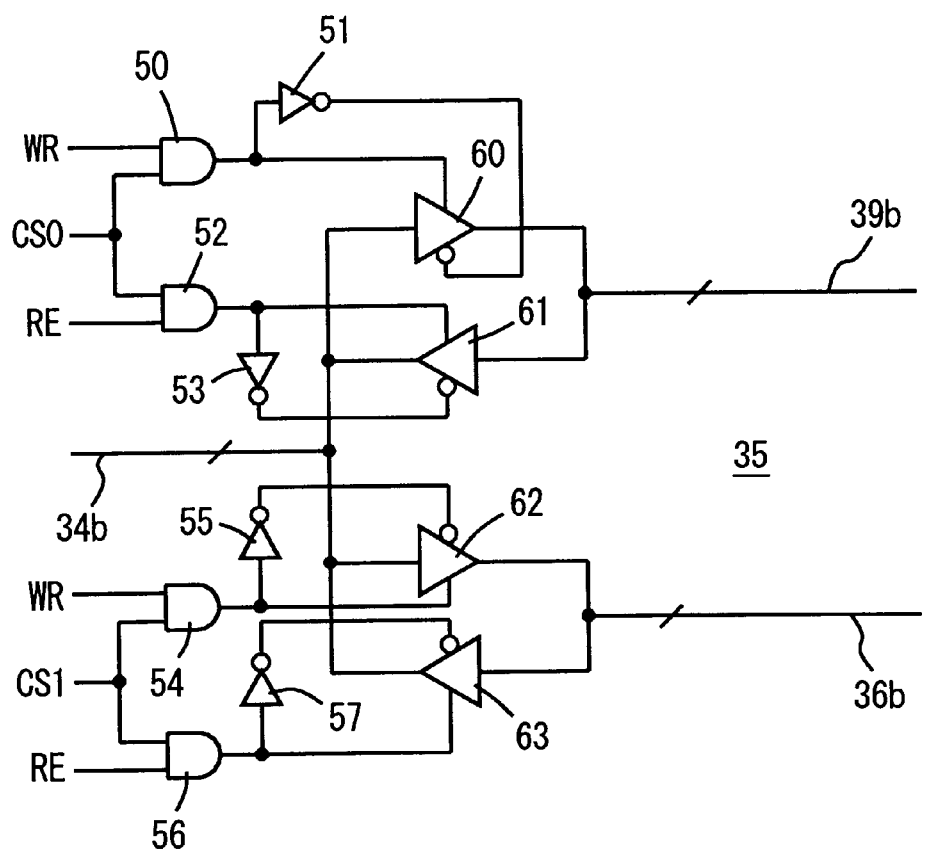
FIG. 7 shows an example of a structure of a bidirectional transfer unit of the selector of FIG. 3.

FIG. 7 shows an example of a circuit of the portion of selector 35 corresponding to a bidirectional data bus. This bidirectional data bus corresponds to the structure in which data is transferred bidirectionally between the internal bus and memory buses 39 and 36. In order to specify the data transfer direction in the bidirectional data bus, a write designating signal WR instructing data writing and a read designating signal RE instructing data read out are generated at BIU 33. The data transfer path in selector 35 is determined by these signals WR and RE.

Referring to FIG. 7, selector 35 includes an AND circuit 50 receiving write designating signal WR and predecode signal CS0 to generate a control signal for determining the transfer path, an inverter circuit 51 inverting the output signal of AND circuit 50, an AND circuit 52 receiving predecode signal CS0 and read designating signal RE, an inverter circuit 53 inverting the output signal of AND circuit 52, an AND circuit 54 receiving predecode signal CS1 and write designating signal WR, an inverter circuit 55 inverting the output signal of AND circuit 54, an AND circuit 56 receiving predecode signal CS1 and read designating signal RE, and an inverter circuit 57 inverting the output signal of AND circuit 56.

Selector 35 also includes a tristate buffer circuit 60 rendered active in response to the output signals of AND circuit 50 and inverter 51 to drive memory bus 39b according to the signal/data on internal bus 34b, a tristate buffer circuit 61 selectively rendered active in response to the output signals of AND circuit 52 and inverter circuit 53 to drive internal bus 34b according to the signal/data on memory bus 39b, a tristate buffer circuit 62 selectively rendered active according to the output signals of AND circuit 54 and inverter 55 to drive memory bus 36b according to the signal/data on internal bus 34b, and a tristate buffer circuit 63 selectively rendered active in response to the output signals of AND circuit 56 and inverter circuit 57 to drive internal bus 34b according to the signal/data on memory bus 36b.

Tristate buffer circuits 60–63 each include tristate buffers adapted to respective bus widths of memory buses 39b and 36b. AND circuits 50, 52, 54 and 56 and inverter circuits 51, 53, 55 and 57 are disposed common to the tristate buffer provided corresponding to each bus signal line.

According to the structure of selector 35 shown in FIG. 7, write designating signal WR is rendered active in a data write mode, whereby AND circuits 52 and 54 are enabled. One of tristate buffer circuits 60 and 62 is rendered active according to predecode signals CS0 and CS1. In a data read mode, read designating signal RE is rendered active, and AND circuits 52 and 56 are enabled. Under this state, one of tristate buffer circuits 61 and 63 is rendered active according to predecode signals CS0 and CS1.

By arranging these bidirectional tristate buffer circuits 60–63, which are selectively rendered active according to a predecode signal and an operation mode designating signal instructing data writing/reading, data can be reliably transferred bidirectionally.

Only the parasitic capacitance of tristate buffer circuits 60–63 is connected to internal bus 34b in the construction of selector 35 shown in FIG. 7. Therefore, the parasitic capacitance can be reduced significantly, as compared to the structure where memories 20 and 37 are connected in common with internal bus 34b. Since internal bus 34b is driven by tristate buffer circuits 61 or 63 and memory buses 39b and 36b are driven by tristate buffer circuit 62, data can be transferred at high speed.

[Modification 1]

Figure 8:
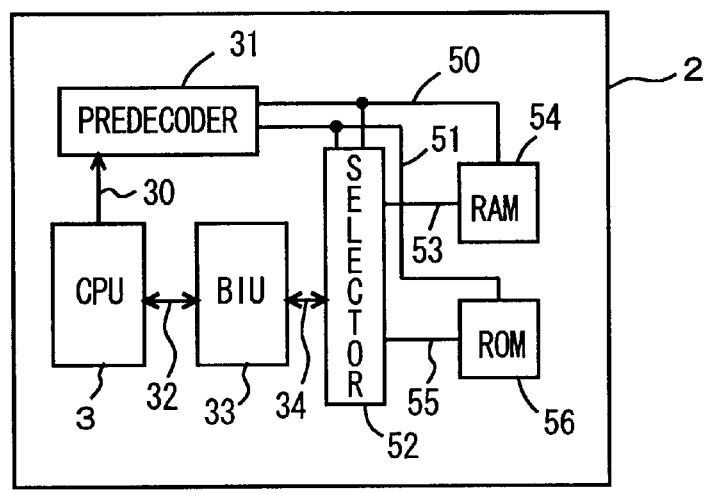
FIG. 8 schematically shows a modification of the third embodiment of the present invention.

FIG. 8 shows schematically a structure of a modification of the third embodiment. In FIG. 8, a ROM 56 and a RAM 54 are arranged in internal circuitry region 2. RAM 54 and ROM 56 are coupled to selector 52 via memory buses 53 and 55, respectively.

Selector 52 is responsive to a memory select signal from predecoder 31 for coupling one of memory buses 53 and 55 to internal bus 34. Predecoder 31 decodes the memory address signal applied from CPU 3 via address bus 30 to transmit a memory select signal (chip select signal CS) specifying RAM 54 or ROM 56 onto control buses 50 and 51, respectively. ROM 56 and RAM 54 are divided into a plurality of blocks. These ROM 56 and RAM 54 can be selected on a block-by-block basis according to the memory select signal (predecode signal) from predecoder 31. The blocks of RAM 54 and ROM 56 are coupled to corresponding memory buses 53 and 55, respectively.

According to the structure of FIG. 8, RAM 54 and ROM 56 are coupled to selector 56 via separate memory buses 53 and 55 in internal circuitry region 2. When CPU 3 accesses either RAM 54 or ROM 56, selector 52 couples one of memory buses 53 and 55 to internal bus 34 according to the memory select signal from predecoder 31. Therefore, the load on the internal bus is alleviated, as compared to the structure where both RAM 54 and ROM 56 are both coupled to internal bus 34. Thus, data can be transferred at high speed.

According to the structure shown in FIG. 8, another memory can be disposed at an outer region to the pads (not shown) outside internal circuitry region 2. A bus is provided for the external memory and RAM 54 and RAM 56, so that any of the memory, RAM 54 and ROM 56 disposed at a region outside the pads is coupled to BIU 33 through the selector.

[Modification 2]

Figure 9:
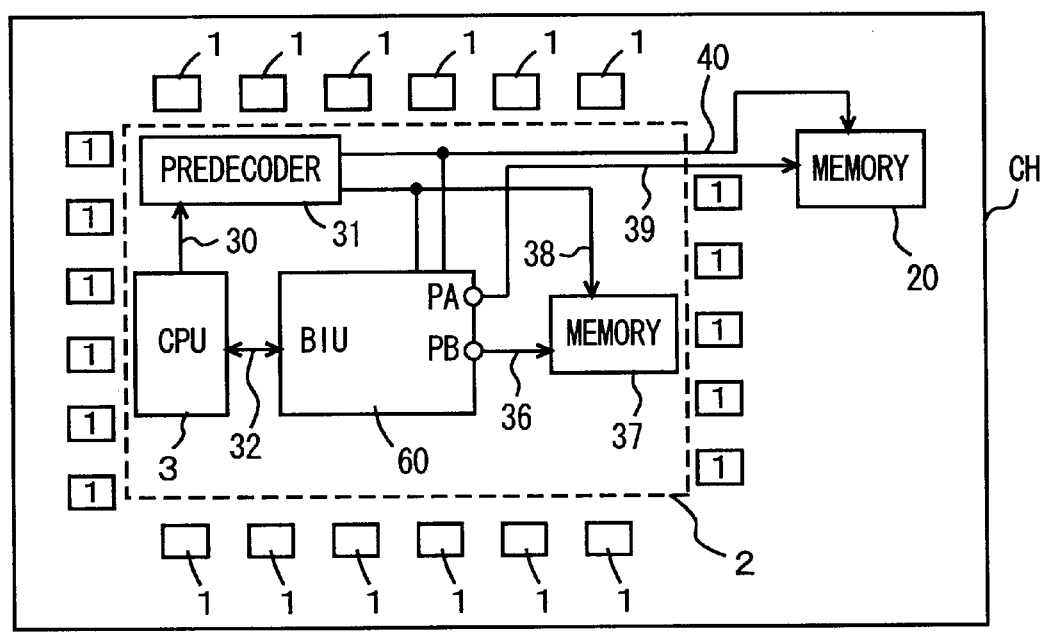
FIG. 9 schematically shows a structure of another modification of the third embodiment of the present invention.

FIG. 9 shows schematically a structure of a second modification of the third embodiment of the present invention. Referring to FIG. 9, BIU60 includes a port PA coupled to memory bus 39, and a port PB coupled to memory bus 36. BIU 60 activates the port arranged corresponding to the selected memory according to the memory select signal from predecoder 31, to transmit data/signal onto memory bus 39 or 36 via the activated port PA or PB. The remaining structure is similar to that shown in FIG. 3. Corresponding components have the same reference characters allotted, and detailed description thereof will not be repeated.

According to the structure shown in FIG. 9, BIU60 has a memory bus select function so that a selector is dispensable to reduce the circuit occupying area.

Figure 10:
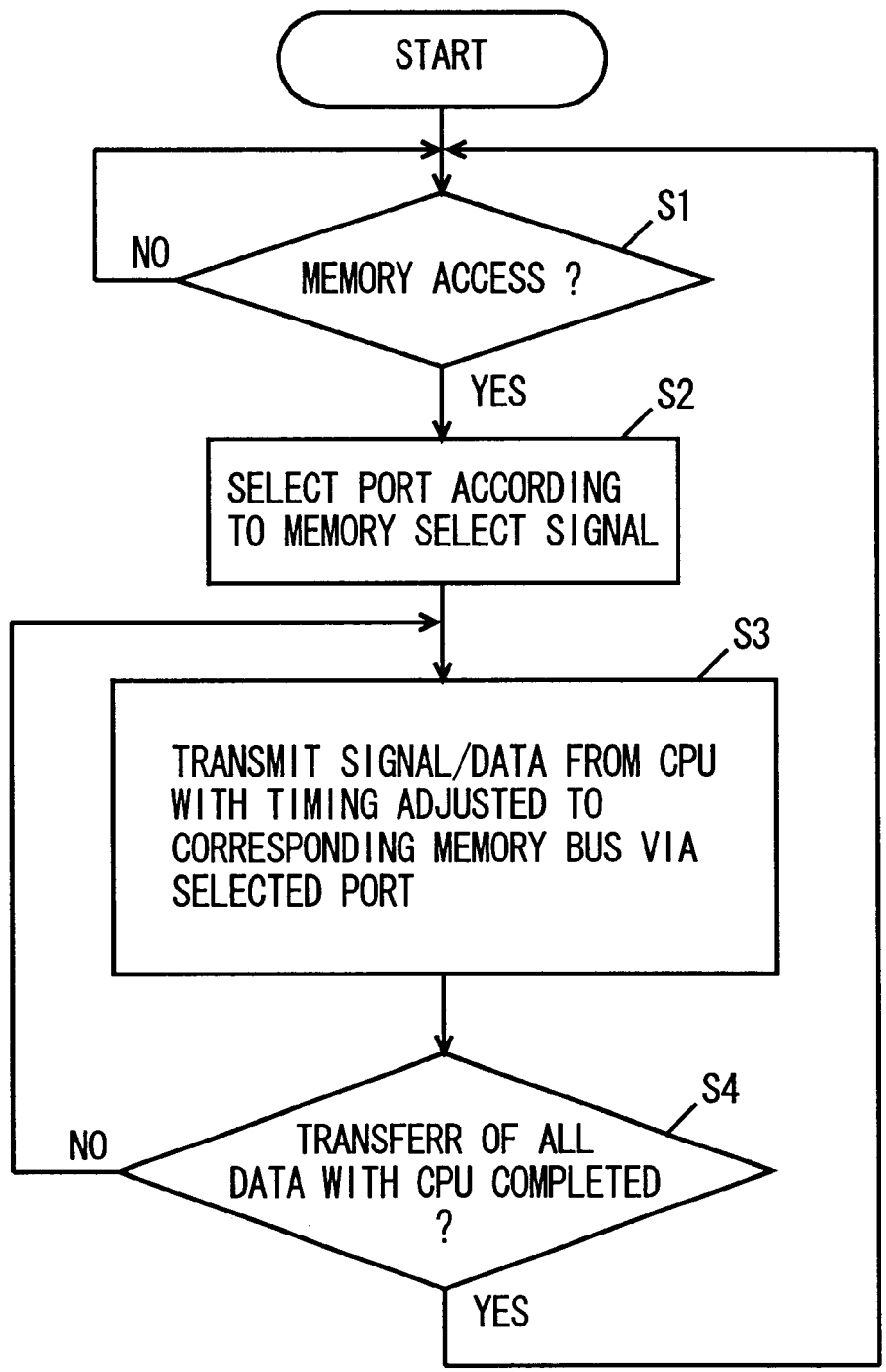
FIG. 10 is a flow chart representing a data transfer operation of the semiconductor integrated circuit device of FIG. 9.

FIG. 10 is a flow chart representing an operation of BIU60 of FIG. 9. The operation of BIU60 of FIG. 9 will now be described briefly with reference to FIG. 10.

BIU60 constantly monitors whether there is an access request to a memory from CPU 3. A memory needs to be accessed when CPU 3 executes a load instruction or a store instruction, for example. Accordingly, a memory access request is issued to BIU60 via bus 32 (step S1).

In response to a memory access request from CPU 3, BIU60 selects a port corresponding to a specified memory according to the memory select signal from predecoder 31 (step S2).

BIU60 receives an address signal, a control signal, and write data applied from CPU 3 in execution of a store instruction, and adjusts the timing of the received signal/data from CPU 3 for transmission to the corresponding memory bus via the selected port in synchronization with a clock signal, for example (step S3).

BIU60 determines whether all the data are transferred which are requested for transference by CPU 3 (step S4). The necessary control signal and address signal are repeatedly transferred via the selected port until all the data are transferred. Here, transfer of data greater in amount than the burst length is considered in a burst transfer mode.

BIU60 returns to step S1 when the transfer of all data from/to CPU 3 is completed, and waits for the issuance of the next access request from CPU 3.

As shown in FIG. 9, since BIU 60 has a memory bus select function, the port of BIU60 is selectively rendered active in a memory access operation. A selector need not be provided additionally. Therefore, the circuit layout is simplified.

Also, memories 20 and 37 are connected to memory buses 39 and 36, respectively. Therefore, the memory bus load (interconnection capacitance) can be alleviated.

In the structure of FIG. 9, another memory may be disposed at a region outside pads 1 opposite to memory 20 on semiconductor chip CH.

According to the third embodiment of the present invention, the internal bus is coupled to only the memory to be accessed. The bus load is alleviated to achieve signal/data transfer at high speed with low power consumption. Even in the case where a memory is disposed outside the pads and the load on the bus may become greater if the interconnection length becomes longer, the load on that bus can be reliably reduced to achieve signal/data transfer at high speed.

As described above, the memory disposed outside the pads and the memory disposed in a region surrounded by pads are coupled to separate buses, and these memories are selectively coupled to the BIU via a selector. Therefore, the arrangement of internal circuitry including the selector for bus selection need not be altered even in the case where the capacity of the memory located outside the pads is modified. Thus, even if only the memory capacity of the memory located outside the pads is modified in modifying the memory capacity of the semiconductor integrated circuit device, the layout of the internal circuitry is kept unchanged, and the CPU can accurately access the memory located outside the pads irrespective of the memory capacity.

Fourth Embodiment

Figure 11:
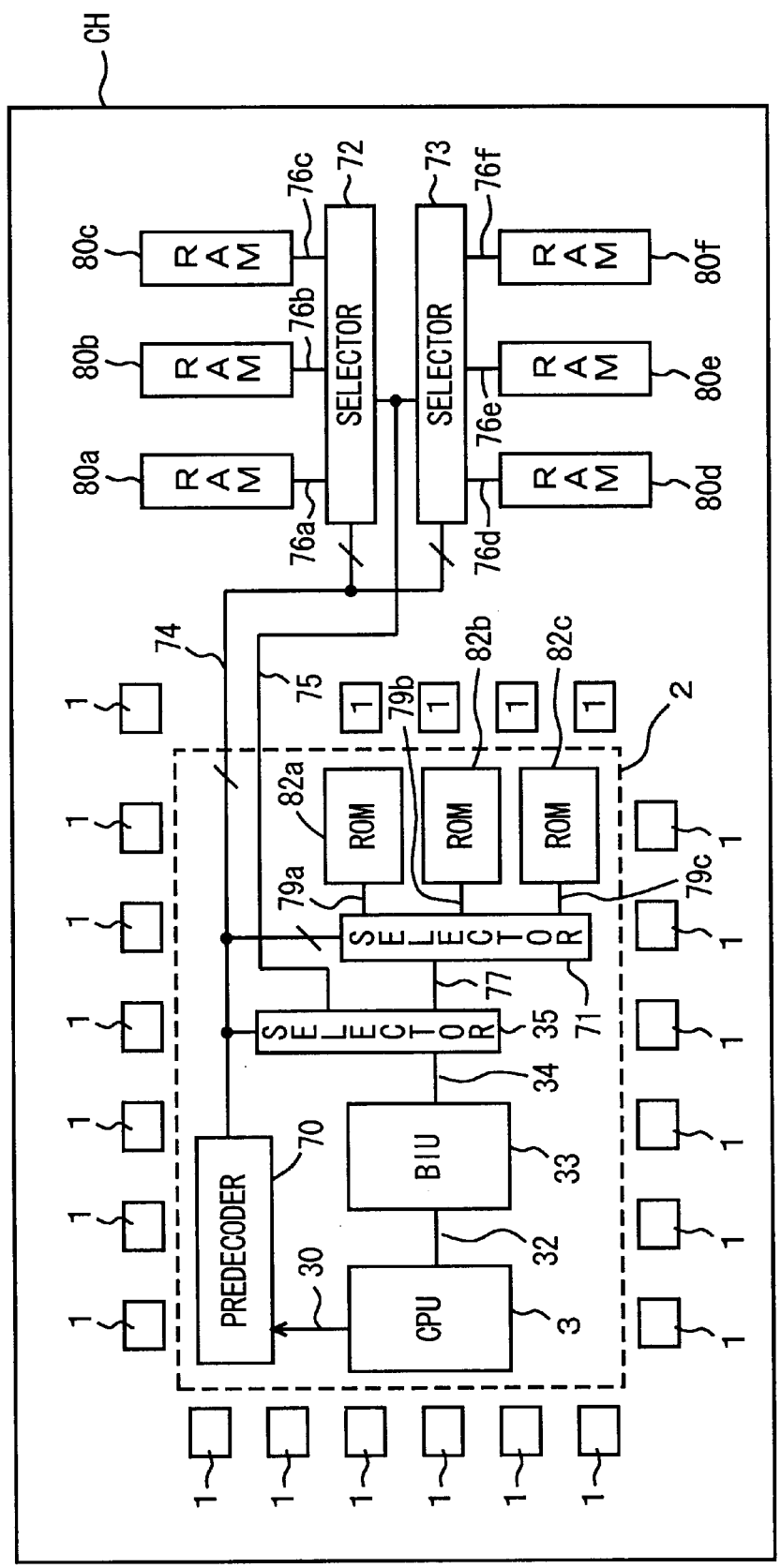
FIG. 11 schematically shows an entire structure of a semiconductor integrated circuit device according to a fourth embodiment of the present invention.

FIG. 11 schematically shows an entire structure of a semiconductor integrated circuit device according to a fourth embodiment of the present invention. Referring to FIG. 11, a plurality of ROMs 82a–82c are coupled to a selector 71 via local memory buses 79a–79c, respectively, in internal circuitry region 2.

In the region outside pads 1 of semiconductor chip CH, RAMs 80a–80f are arranged. RAMs 80a–80c are coupled to selector 72 via local memory buses 76a–76c, respectively. RAMs 80d–80f are coupled to a selector 73 via local memory buses 76d–76f.

Selector 71 electrically connects any of local memory buses 79a–79c to memory bus 77 according to the memory select signal applied on control bus 74 from predecoder 70. Selectors 72 and 73 electrically connect the local memory bus corresponding to the selected RAM to memory bus 75 according to the memory select signal applied on control bus 74 from predecoder 70.

Selector 35 is provided to electrically connect memory buses 75 and 77 to internal bus 34. Selector 35 connects one of memory buses 75 and 77 to internal bus 34 according to the memory select signal applied on control bus 74. When either one of ROMs 82a–82c disposed in internal circuitry region 2 is selected, selector 35 connects memory bus 77 to internal bus 34. When any of RAMs 80a–80f disposed outside the region of pad 1 is selected, selector 35 electrically connects memory bus 75 to internal bus 34.

Predecoder 70 predecodes the memory address signal applied from CPU 3 via address bus 30 to generate a memory select signal. This memory select signal includes a memory select signal specifying a ROM and a RAM, a ROM block select signal specifying any of ROMs 82a–82c, and a RAM block select signal specifying any of RAMs 80a–80f.

CPU 3 is coupled to selector 35 via BIU 33.

The memory select signal applied on control bus 74 from predecoder 70 drives the transmission gate or tristate buffer included in selectors 71, 72 and 73. Therefore, the signal applied on control bus 74 is required to drive the gate capacitance of these tristate gates or tristate buffers. An input buffer of each of RAMs 80a–80f is connected to local memory buses 76a–76f, respectively. ROM 82a–82c are connected to local memory buses 79a–79c, respectively.

The input impedance of the input buffer is the gate capacitance of both a P-channel MOS transistor (insulation gate field effect transistor) and an N-channel MOS transistor where the input buffer is a CMOS inverter, and it is required to drive the gate capacitance. The gate capacitance of the input buffer becomes greater than that of the transmission gate or the gate of the tristate buffer (in the case of a transmission gate or tristate buffer, the activation/inactivation of each MOS transistor is controlled by complementary signals).

However, only the selected one of RAMs 80a–80f is coupled to memory bus 74 via selector 72 or 73. Therefore, the load on memory bus 74 (interconnection capacitance) can be alleviated, as compared to the case where RAMs 80a–80f are coupled in common with memory bus 74. The same applies to ROMs 82a–82c.

Selectors 72 and 73 may be arranged adjacent to pads 1. The position of selectors 72 and 73 is at any region on semiconductor chip CH, and the arrangement position thereof is determined so as to optimize the layout on semiconductor chip CH. Therefore, the load on control bus 74 becomes smaller than the load (interconnection capacitance) of local memory buses 76a–76f. Accordingly, a memory select signal can be transmitted from predecoder 70 at high speed via control bus 74.

According to the structure shown in FIG. 11, selectors 35 and 71–73 select a memory (ROM or RAM) to be accessed according to a memory select signal from predecoder 70. In the case where a ROM in internal circuitry region 2 is to be accessed, selector 71 selects and couples to memory bus 77 one of ROMs 82a–82c. Selector 35 couples this memory bus 77 to internal bus 74.

In the case where any of RAMs 80a–80f arranged outside pads 1 is to be accessed, selectors 72 and 73 select one of RAMs 80a–80f according to the memory select signal applied from predecoder 70 onto control bus 70, whereby the corresponding local memory bus is connected to memory bus 75. Selector 35 couples memory bus 75 to internal bus 34 according to the memory select signal from predecoder 70.

The memory bus is divided according to the types and arrangement positions of the memories and the blocks, and the load on the memory bus is alleviated. Particularly, in the case where one memory block (ROM or RAM) is to be accessed, only the local memory bus and memory bus connected to the memory of an access target are connected to internal bus 34. The bus interconnection capacitance can be minimized to achieve high speed access. In addition, the time required for charging and discharging the bus can be shortened and power consumption can be reduced.

Selectors 35 and 71–73 can be formed of a transmission gate or a tristate buffer circuit. In selectors 71–73, transmission gates or tristate buffer circuits are arranged corresponding to the respective local memory busses 76a–76f and 79a–79c.

In selector 35, transmission gates or tristate buffer circuits are arranged corresponding to memory buses 75 and 77, and the transmission gate or tristate buffer circuit is selectively rendered active according to the memory select signal from predecoder 70. Here, an activated state of the transmission gate indicates a conductive state.

Therefore, the memory select signal from predecoder 70 includes a signal indicating whether the memory is arranged in the internal circuitry region or a region outside pads 1, and a block select signal identifying the memory itself.

As in the previous third embodiment, BIU 33 adjusts the timing according to an access request from CPU 3 and transfers the required signal/data to memory bus 75 or 77 via selector 35.

In the above-described structure, a ROM is disposed in internal circuitry region 2 whereas a RAM is disposed a region outside pads 1. It is merely required to determine the type of these memories appropriately according to the structure of the one-chip microcontroller or microprocessor, and ROM may be disposed in internal circuitry region 2. Alternatively, the ROM may be arranged in a region outside pads 1. In addition, the ROM and RAM may be disposed in a region outside pads 1 on both sides of internal circuitry region 2. Moreover, a ROM and RAM may be disposed in a region outside pads 1 in a mixed manner.

Modification 1

Figure 12:
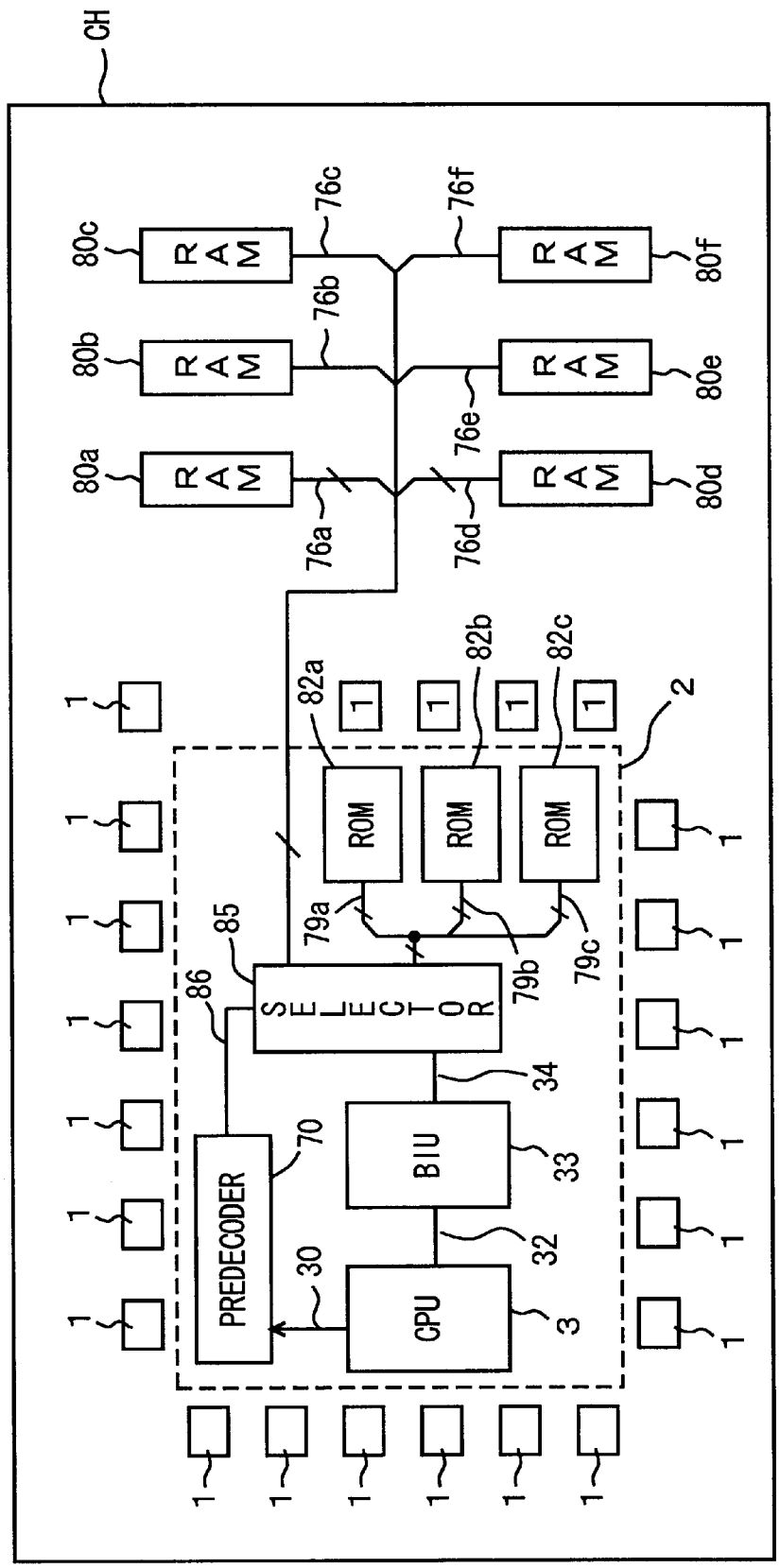
FIG. 12 schematically shows a structure of a modification of the fourth embodiment of the present invention.

FIG. 12 schematically shows a structure of a modification of the fourth embodiment of the present invention. In the structure shown in FIG. 12, local memory buses 79a–79c provided corresponding to ROMs 82a–82c, respectively, are coupled in parallel to selector 85. Local memory buses 76a–76f provided corresponding to RAMs 80a–80f disposed at the region outside pads 1, respectively, are coupled to selector 85 in parallel. Selector 85 selects one of local memory buses 79a–79c according to the memory select signal applied on control bus 86 from predecoder 70 and 76a–76f and couples the selected one to internal bus 34.

According to the structure of FIG. 12, the local memory bus corresponding to a selected memory is selected by one stage of selector 85 according to the memory select signal from predecoder 70. Therefore, the number of stages of selectors is reduced, and the gate propagation delay of the selector can be reduced to achieve high speed data transfer.

The remaining structure shown in FIG. 12 is similar to that shown in FIG. 11. Corresponding components have the same reference characters allotted.

Selector 85 may be provided in BIU 33. In the case where selector 85 is embedded in BIU 33, selector 85 functions as a so-called port selector.

According to the structure shown in FIG. 12, a ROM is disposed in internal circuitry region 2 whereas a RAM is disposed at a region outside pads 1. However, the ROM and RAM may be arranged in internal circuitry region 2 or in a region outside pads 1, according to the structure shown in FIG. 12.

Also, only the ROM may be disposed at a region outside pads 1 instead of a RAM.

Also, a memory (ROM and/or RAM) may be arranged at a region outside pads 1 opposite to the region where the RAM is arranged with respect to internal circuitry region 2.

According to the fourth embodiment, the memory is divided into a plurality of blocks, and a local memory bus is provided corresponding to each memory block. A selected memory block is coupled to the internal bus of according to a memory select signal. The internal bus load (interconnection capacitance) is alleviated to achieve high-speed signal/data transfer with low power consumption. By arranging the memory at a region outside pads 1, advantages similar to those of the first embodiment can be achieved.

Since the selector is arranged in a region surrounded by the pads, the layout of the internal circuitry in the region surrounded by the pads can be fixed, together with the memory bus.

Fifth Embodiment

Figure 13:
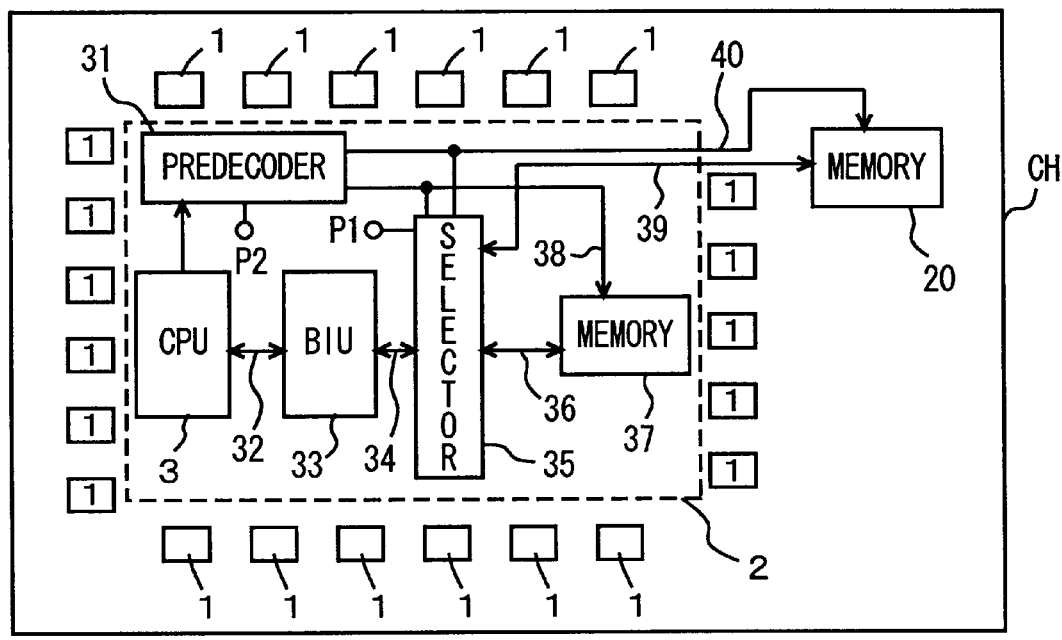
FIG. 13 schematically shows an entire structure of a semiconductor integrated circuit device according to a fifth embodiment of the present invention.

FIG. 13 schematically shows a structure of a semiconductor integrated circuit device according to a fifth embodiment of the present invention. In the structure shown in FIG. 13, predecoder 31 outputs a memory select signal in synchronization with a clock signal P2. Selector 35 transfers the applied signal/data in synchronization with a clock signal P1. These clock signals P1 and P2 are two phase, non-overlapping clock signals. The remaining structure of the semiconductor integrated circuit device shown in FIG. 13 is similar to that of the semiconductor integrated circuit device shown in FIG. 3. Corresponding components have the same reference characters allotted, and detailed description thereof will not be repeated.

Figure 14:
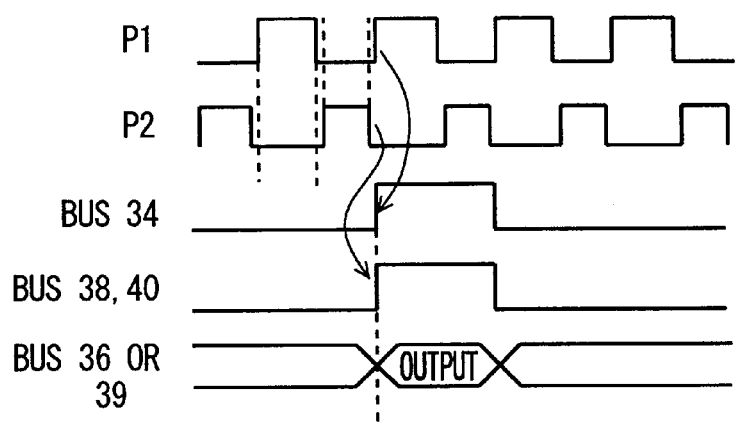
FIG. 14 is a timing chart representing a signal/data transfer operation of the selector of FIG. 13.

FIG. 14 is a timing chart representing an operation of the semiconductor integrated circuit device of FIG. 13. The operation of the semiconductor integrated circuit device of FIG. 13 will now be described with reference to FIG. 14.

Predecoder circuit 31 takes in a memory address signal applied from CPU 3 in synchronization with the rise of clock signal P2 to perform a decode operation. Predecoder 31 outputs a predecode signal onto buses 38 and 40 in synchronization with the fall of clock signal P2.

Selector 35 executes a transfer operation in synchronization with clock signal P1. In this operation, BIU 33 transmits the required signal/data onto internal bus 34 in synchronization with the rise of clock signal P1. BIU 33 maintains the output signal during one clock cycle of clock signal P1. Predecoder 31 maintains the output predecode signal during one clock cycle of clock signal P2.

Therefore, when the capture and transfer of the data/signal is enabled in synchronization with clock signal P1, a memory select signal is already output on buses 38 and 40. Selector 35 can output a corresponding signal onto memory bus 39 or 36 according to the signal/data transmitted on internal bus 34 from bus interface unit BIU 33.

Clock signals P1 and P2 are complementary two phase, non-overlapping clock signals, and rise and fall substantially at the same timing. Therefore, the signal/data transmitted from BIU 33 can be correctly transmitted to memory bus 36 or 39. In other words, the data/signal from BIU 33 attains a definite state when selector 35 performs a select operation according to the memory select signal from predecoder 31. The periods of the definite states are also substantially the same. Therefore, the signal/data can be transferred properly.

When a memory bus corresponding to the selected memory is selected according to the memory select signal from predecoder 31, the data/signal can be transferred correctly to the selected memory. Specifically, since the switch of the memory bus and the switch of the transfer signal/data are effected substantially at the same timing, a signal/data directed to the selected memory can be prevented from being transferred to a non-selected memory block. Thus, access can be made correctly to a selected memory.

Clock signals P1 and P2 may be clock signals generated from an internal clock generator in the semiconductor integrated circuit device, or may be applied from a clock generator, which in turn generates a system clock and is arranged outside the semiconductor integrated circuit device.

Figure 15:
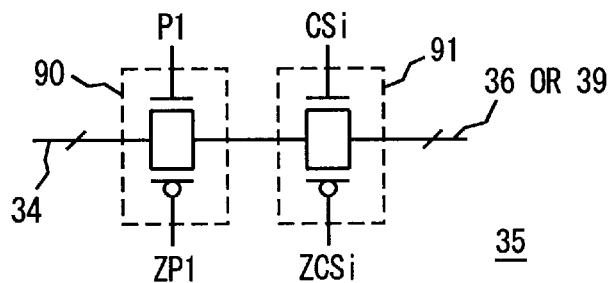
FIG. 15 shows an example of a structure of the selector of FIG. 13.

FIG. 15 shows an example of a structure of selector 35 of FIG. 13. Referring to FIG. 15, selector 35 includes a transmission gate 90 selectively rendered conductive according to clock signal P1 and an inverted clock signal ZP1, and a transmission gate 91 selectively rendered conductive according to memory select signals CSi and ZCSi. These transmission gates 90 and 91 are connected in series to electrically couple internal bus 34 with memory bus 36 or 39 when conductive.

According to the structure shown in FIG. 15, inverted clock signal ZP1 is at an L level when clock signal P1 is at an H level. Transmission gate 90 is made conductive to transmit the signal applied on internal bus 34 from BIU 33 to the transmission gate 91 at the next stage. When memory select signals CSi and ZCSi are made active, transmission gate 91 turns conductive to transmit the signal/data transmitted via transmission gate 90 to memory bus 36 or 39.

As selector 35, a tristate buffer circuit may be employed instead of transmission gates 90 and 91.

Modification

Figure 16A:
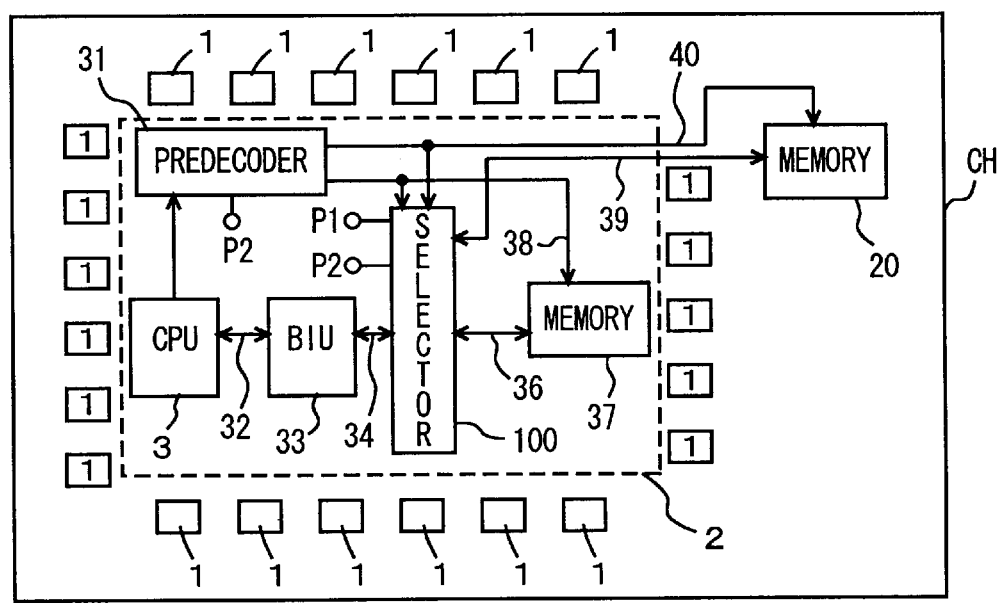
FIG. 16A schematically shows a structure of a modification of the fifth embodiment of the present invention.

FIG. 16A schematically shows a structure of a modification of the fifth embodiment of the present invention. In FIG. 16A, predecoder 31 outputs a memory select signal onto control buses 38 and 40 in synchronization with the rising edge of clock signal P2.

A selector 100 outputs the signal/data transmitted on bus 34 from BIU 33 to memory bus 36 or 39 corresponding to the selected memory according to complementary two phase, non-overlapping clock signals P1 and P2. Specifically, selector 100 transmits the signal on internal bus 34 to memory bus 36 or 39 corresponding to the selected memory in synchronization with the rise of clock signal P1. Selector 100 selects the memory bus, while setting the memory select signal output from predecoder 31 into a valid state in synchronization with the rise of clock signal P2. The operation of the semiconductor integrated circuit device of FIG. 16A will now be described with reference to the timing chart of FIG. 16B.

Predeocder 31 predecodes the memory address signal applied from CPU 3 to transmit the memory select signal (predecode signal) onto control buses 38 and 40 in synchronization with the rising edge of clock signal P2. At this stage, BIU 33 does not output a signal/data on internal bus 34 yet. Therefore, selector 100 selects a memory bus according to the memory select signal transmitted on control buses 38 and 40.

In response the rise of clock signal P1, selector 100 transmits the signal/data output onto internal bus 34 from BIU 33 to memory bus 36 or 39 corresponding to the selected memory. The memory select signal on control buses 38 and 40 are rendered inactive in synchronization with a rise of clock signal P2 in the signal/data transfer cycle of selector 100. By arranging a latch circuit for these memory buses 36 and 39, the transferred signal/data can be latched correctly during the transfer operation of selector 100. Therefore, the signal/data can be transferred by the latch circuit even when selector 100 is rendered nonconductive.

By operating the selector and predecoder using clock signals of opposite phases, and causing the selector to take in the select control signal and transfer signal according to the complementary clock signals of two phases, the signal/data can be transferred properly even if the definite timing of the memory select signal from predecoder 30 is delayed. In other words, the memory bus arranged corresponding to a selected memory can be driven according to the transfer data/signal. The memory bus corresponding to the selected memory can be driven fully according to the transfer signal/data since the memory select signal from predecoder 31 is active for at least half the cycle period of clock signal P2.

The transfer signal can be held reliably by the latch circuit even if the memory select signal attains an inactive state. Therefore, even if the activation timing of the memory select signal from predecoder 31 is delayed, the memory select signal for select circuit 100 attains a definite state before the transfer signal/data of internal bus 34 is made definite. The memory bus corresponding to the selected memory is selected by select circuit 100. The transfer signal/data can be reliably transmitted to the selected memory.

Even in the case where the memory select signal selects another memory, i.e., even if the selected bus is switched by the memory select signal, the signal/data can be transferred properly since the transfer data/signal is latched by the latch circuit.

When the signal/data to be transferred is output onto internal bus 34 from BIU 33, selector 100 can transmit the signal/data on bus 34 to the selected memory bus at high speed since the transfer path for the selected memory is already in a conductive state by the memory select signal from predecoder 31.

In the case where the change of the memory select signal of control bus 34 lags behind the changing timing of the transfer signal/data in the structure shown in FIG. 15, the transfer data/signal may be transmitted to the non-selected memory. In this case, the bus corresponding to the non-selected memory is charged/discharged according to the transfer signal/data to the selected memory, and the non-selected memory bus may possibly be held at an intermediate potential.

In such a case, if a latch circuit is arranged at the output of selector 35, through current may possibly flow at the latch circuit to increase the consumed current. The latch circuit, of which the structure will be described in detail later, is generally formed of an inverter latch, and through current would flow by a signal of an intermediate voltage level in such inverter.

However, by driving selector 100 with clock signals of 2 phases and selecting a memory bus after changing of the transfer signal/data on internal bus 34, such a situation is avoided that the non-selected memory bus receives the transfer signal/data to be held at an intermediate potential. Thus, the transfer signal/data can be reliably transmitted to the memory bus corresponding to the selected memory.

A floating state of the bus can be prevented by arranging the latch circuit at the output node of selector 100, as well as internal buses 34 and 32. Such an arrangement is also advantageous to ensure the internal transfer of the transfer signal/data.

Similarly, in the case where the data read out from memory 37 or 20 is to be transferred to BIU 33, the activation of selector 100 and predecoder 35 at a similar timing enable the data read out on memory bus 36 or 39 to be transferred to BIU 33 via internal bus 34 at high speed.

In the case where the transfer route switching time point of selector 100 lags behind the changing time point of the transfer signal/data, the transfer signal/data may be transferred to the non-selected memory bus. For example, in the case where the memory select signal of memory buses 38 and 40 change to select another memory, the signal/data on bus 34 would be transferred to a memory bus to be set to a non-selected state in the timing chart of FIG. 14. In the case where the bus switching time difference is short, the memory bus to turn non-selected cannot be driven sufficiently, so that the potential would attain an intermediate level. If a latch circuit is arranged, through current would flow in the latch circuit connected to the memory bus to turn non-selected, resulting in increased consumed power.

Figure 16B:
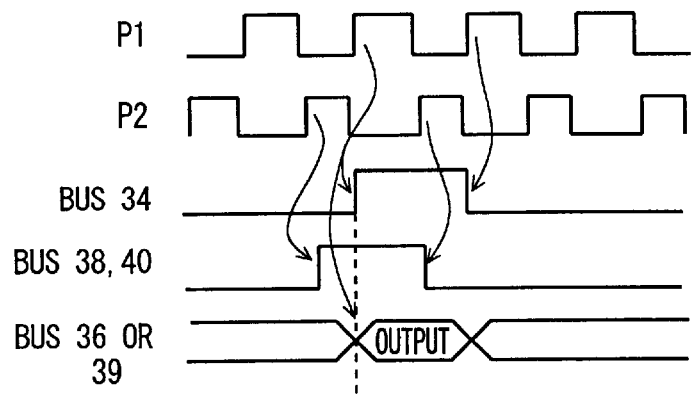
FIG. 16B is a timing chart representing a signal/data transfer operation of the selector of FIG. 16A.

However, as shown in FIG. 16B, the period of time for transferring the signal/data to the selected memory is sufficient, and it is possible to reliably prevent the bus corresponding to a non-selected memory from being held at the intermediate potential level.

In the case where the selected memory is altered at a rise or fall of the signals on buses 38 and 40 in the waveform diagram of FIG. 16B, the signal/data to be transferred to the selected memory would not be transmitted to the memory bus to be turned non-selected at the rise of the signal of buses 38 and 40. Although the signal/data transferred to the memory to be non-selected is transferred to the selected memory, this is of no concern since it is updated by the subsequently transferred signal/data.

At the time of a fall of the signal of buses 38 and 40, the selected memory bus is disconnected from bus 34. Therefore, the signal/data of the selected memory bus is reliably latched by the latch circuit. Therefore, the problem of an intermediate potential will not occur. Although the signal/data output onto bus 34 will be transferred to the memory bus to be selected next, the signal/data of the previously selected memory is updated by the correct signal/data transferred next. Therefore, the problem of an intermediate voltage will not occur in the memory to be selected.

Figure 17:
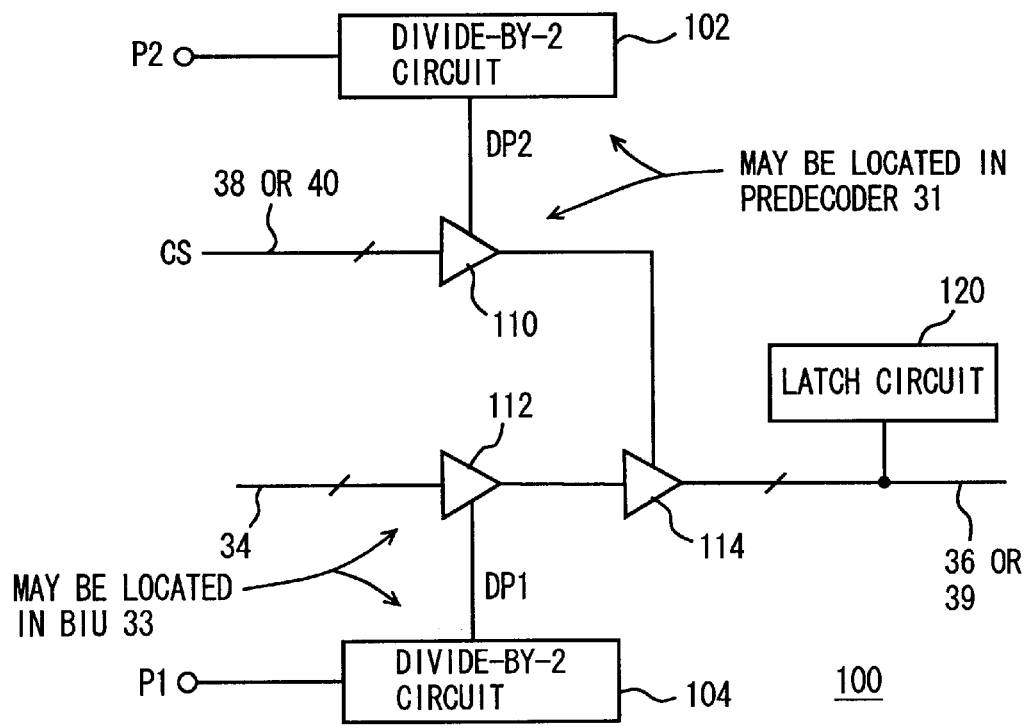
FIG. 17 schematically shows an example of a structure of the selector of FIG. 16A.

FIG. 17 shows an example of a structure of selector 100 of FIG. 16A. Referring to FIG. 17, selector 100 includes a divide-by-2 circuit 102 dividing a frequency of clock signal P2 by a factor of 2, a tristate buffer circuit 110 rendered active when a divided clock signal DP2 from divide-by-2 circuit 102 is at an H level to transmit a memory select signal CS transmitted from predecoder 31 to control bus 38 or 40, a divide-by-2 circuit 104 frequency-dividing clock signal P1 by a factor of 2, a tristate buffer circuit 112 rendered active when a divided clock signal DP1 from divide-by-2 circuit 104 is at an H level to transmit the signal on internal bus 34, and a tristate buffer circuit 114 transmitting the output signal of tristate buffer circuit 112 onto the next stage memory bus 36 or 30 to according to the output signal of tristate buffer circuit 110.

Memory buses 36 and 39 are each provided with latch circuit 120.

Each of divide-by-2 circuits 102 and 104 is formed of a T flip-flop having its output state altered in response to a rising edge of corresponding clock signal P2 or P1.

During one clock cycle of clock signal P2, divided clock signal DP2 of divide-by-2 circuit 102 is at an H level. Divided clock signal DP1 from divide-by-2 circuit 104 is at an H level for one clock cycle of clock signal P1.

When memory select signal CS is transmitted to control buses 38 and 40 according to clock signal P2, tristate buffer circuit 110 is rendered active to transmit memory select signal CS. In response to this memory select signal CS, tristate buffer circuit 114 connected to the memory bus corresponding to the selected memory is rendered active.

At the rise of clocks signal P1 to an H level, divided clock signal DP1 goes high to be at an H level for one clock cycle of clock signal P1. The signal/data transmitted on internal bus 34 is applied to tristate buffer circuit 114 at the next stage. When tristate buffer circuit 112 is rendered active, tristate buffer circuit 114 is already active. Therefore, the signal/data can be transferred at high speed to selected memory bus 36 or 39.

When memory select signal CS from predecoder 31 goes low to an L level in response to a rise of clock signal P2, memory select signal CS on control buses 38 and 40 attains an inactive state. In this state, divided clock signal DP2 output from divide-by-2 circuit 102 is driven to an L level. Tristate buffer circuit 110 enters an output high impedance state.

However, the signal/data is already transferred to selected memory bus 36 or 39 from tristate buffer circuit 114 in this state. By latching the transfer signal/data on bus 36 or 39 by means of latch circuit 120, the signal/data can be reliably transferred to the selected memory.

The latch circuit may be disposed at the output of tristate buffer circuit 110. During the period till the next rise of divided clock signal DP2 to an H level to activate tristate buffer circuit 110, the memory select signal can be latched, whereby tristate buffer circuit 114 can be driven according to the latched memory select signal.

In the case where memory buses 36 and 39 are bidirectional data buses, tristate buffer circuits 112 and 114 are arranged also in the direction of transfer from the memory bus to the internal bus with a signal (write/read designating signal) determining the data transfer direction (refer to FIG. 7) combined with the selector control signal.

Tristate buffer circuits 110, 112 and 114 shown in FIG. 17 include a tristate buffer arranged corresponding to each signal line.

Tristate buffer circuits 110, 112 and 114 each may be formed of a transmission gate.

It to be noted that tristate buffer circuit 110 and divide-by-2 circuit 102 shown in FIG. 17 may be arranged at the output stage of predecoder 31 shown in FIG. 16. Also, divide-by-2 circuit 104 and tristate buffer circuit 112 may be arranged at the output stage of BIU 33. In the case where divide-by-2 circuit 104 and tristate buffer circuit 112 are arranged in BIU 33, the tristate buffer circuit 112 can be arranged in common to memory buses 36 and 39. As a result, the circuit occupying area can be reduced, and power consumption can be reduced.

In the selector that effects connection of a memory bus in the fifth embodiment of the present invention, the enable input and the signal input for data driven in accordance with complementary clock signals of different phases, and the signals/data are made valid. Thus, the transfer operation can be held at an active state before the data input signal of the selector arrives. The signal/data can be transferred to the memory bus immediately when the signal/data to be transferred arrives. Thus, high speed signal/data transfer is achieved.

The non-selected memory bus is not held at an intermediate voltage in a bus switch operation. No through current will flow, and therefore, the consumed current can be reduced.

Sixth Embodiment

Figure 18:
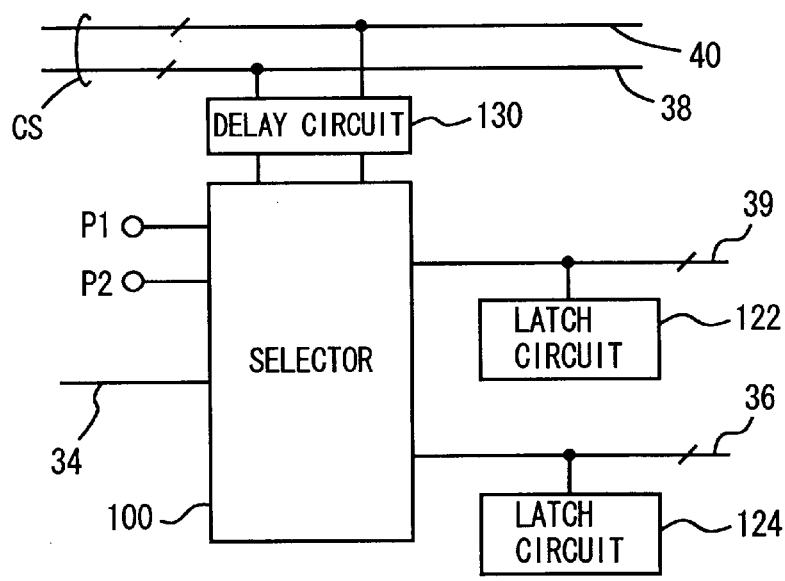
FIG. 18 schematically shows a structure of a main part of a semiconductor integrated circuit device according to a sixth embodiment of the present invention.

FIG. 18 schematically shows a structure of a main part of a semiconductor integrated circuit device according to a sixth embodiment of the present invention. In FIG. 18, a delay circuit 130 is provided for delaying a memory select signal CS transmitted on control buses 40 and 38 from predecoder 31. Selector 100 has a structure similar to that shown in FIG. 17, and transfers a signal/data according to clock signals P1 and P2. Latch circuits 122 and 124 are provided to memory buses 39 and 36, respectively. These latch circuits 122 and 124 correspond to latch circuit 120 shown in FIG. 17. The latching capability of latch circuits 122 and 124 are made low to facilitate the change of the data/signal of memory buses 39 and 36 according to the signal transmitted via selector 100.

Figure 19:
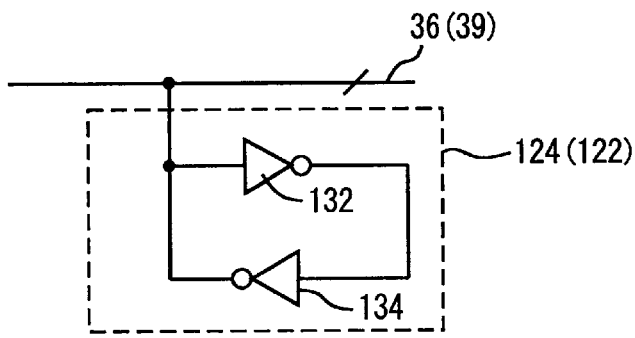
FIG. 19 shows an example of a structure of the latch circuit of FIG. 18.

FIG. 19 shows an example of structure of latch circuits 122 and 124 of FIG. 18. In FIG. 19, latch circuits 122 and 124 have the same structure. Therefore, only the structure of latch circuit 124 provided corresponding to memory bus 36 is depicted. Components of latch circuit 122 arranged corresponding to memory bus 39 is indicated within the parentheses.

Referring to FIG. 19, latch circuit 124 includes an inverter 132 inverting the signal/data on memory bus 36, and an inverter circuit 134 inverting the signal output from inverter 132 for transmission to memory bus 36. The current drivability of inverter circuit 132 is made sufficiently larger than the current drivability of inverter circuit 134. Accordingly, the output drivability of latch circuit 124 is set low to reduce the latching ability. This is done to alter the latching signal/data at high speed according to a transfer signal/data.

Memory bus 36 is a multi-bit bus. A latch circuit shown in FIG. 19 is connected to each respective signal line of memory bus 36.

Figure 20:
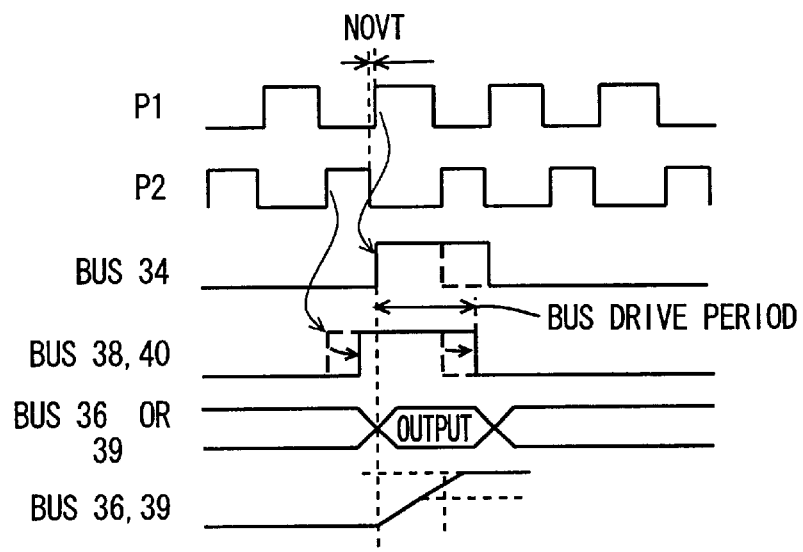
FIG. 20 is a timing chart representing a signal/data transfer operation of the selector of FIG. 18.

FIG. 20 is a timing chart representing a data transfer operation of the selector of FIG. 18. The signal/data transfer operation of selector 100 of FIG. 18 will now be described with reference to FIG. 20.

In response to a rise of clock signal P2, the memory select signal from predecoder 31 shown in FIG. 19 changes. The signal on control buses 38 and 40 are altered according to this memory select signal. This memory select signal CS is transmitted to selector 100 via delay circuit 130. A tristate buffer or transmission gate corresponding to the selected memory is rendered active to be set into a state of allowing a signal transmission in selector 100 according to a delayed memory select signal from delay circuit 130.

At a rise of clock signal P1 to an H level, the signal/data on internal bus 34 changes, and is transmitted to memory bus 39 or 36 arranged corresponding to the selected memory via selector 100. This signal/data is latched by latch circuit 122 or 124.

By means of delay circuit 130, the activation timing of a delayed memory select signal slightly leads the changing time point of the signal on internal bus 34. The period of time of memory select signal CS being at a definite state (H level) can be sufficiently increased equivalently with respect to the transfer signal/data. In addition, the period of time for the tristate buffer circuit to enter an active state to drive the selected memory bus according to the transfer signal/data can be increased.

In response to a rise of clock signal P2 to an H level, the memory select signal output from predecoder 31 is driven to an inactive state. When selector 100 enters a non-conductive state at this time point according to the inactivation of the memory select signal output from predecoder 31, the signal/data may not be transmitted sufficiently to the selected memory bus. Thus, the voltage of selected memory bus 36 or 39 might be held at an intermediate voltage level. If memory bus 36 or 39 is maintained at an intermediate voltage level, through current would flow in latch circuit 122 or 124 due to the intermediate voltage, resulting in increased current dissipation. There is also a problem that the data latch signal is latched at an erroneous logic level due to the intermediate voltage level.

By delaying the activation period of the memory select signal applied to selector 100 using delay circuit 13, the time period of driving the selected memory bus 36 or 39 according to the signal/data on internal bus 34 in selector 100 can be made long enough. This ensures the drive of selected memory bus 36 or 39 to an H or L level, and the period of time during which a through current flows at latch circuit 122 or 124 can be made short enough to reduce the consumed current.

In other words, when selector 100 is driven using two phase, non-overlapping clock signals P1 and P2, the time of driving the selected memory bus according to the signal/data of bus 34 can be made long enough when the non-overlap period NOVT of these clock signals P1 and P2 is long enough.

For example, when the H level period of clock signal P2 is short and the period of time from the fall of clock signal P1 to an L level to a rise of clock signal P2 to an H level is long enough, selector 100 can be reliably kept in a conductive state for a sufficient time period with respect to the transfer signal/data. Therefore, the selected memory bus can be driven according to the data/signal on internal bus 34 correctly.

However, when the non-overlap period NOVT is short, the time period of driving the selected memory bus according to the signal on internal bus 34 would correspond substantially to the H level period of clock signal P1. If the period of bus driving is short, the selected memory bus cannot be driven sufficiently, and would be driven to an intermediate voltage level so that the selected memory bus would possibly be held at that state of the intermediate voltage level.

By delaying the starting and completion timings of the conductive period of selector 100 by means of delay circuit 130, the time period of the conductive state of selector 100 with respect to the transfer signal/data can be set long enough even in such a case. The selected memory bus can be driven sufficiently according to the change of the signal on internal bus 34.

As in the structure shown in FIG. 16A, it is possible to prevent the transfer signal/data from being transferred to a non-selected memory bus even in the case where a delay circuit is employed. Therefore, the problem of a non-selected memory bus being held at an intermediate potential can be avoided.

By using, for example, a falling delay circuit that delays only the timing of transition of memory select signal CS to an inactive state from an active state instead of delay circuit 130 in the structure of FIG. 18, a similar advantage can be obtained.

Modification

Figure 21:
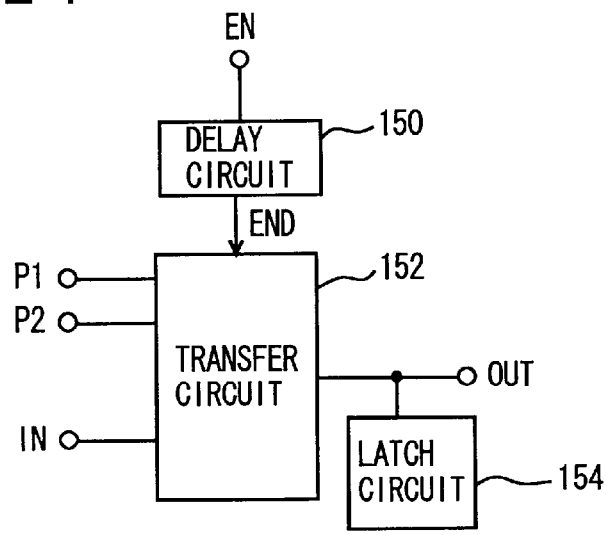
FIG. 21 schematically shows a structure of a modification of the sixth embodiment of the present invention.

FIG. 21 shows a structure of a modification of the sixth embodiment of the present invention. In FIG. 21, a general signal transfer circuit is shown.

Referring to FIG. 21, the signal transfer circuit includes a delay circuit 150 delaying an enable signal EM by a predetermined time, a transfer circuit 152 selectively rendered conductive according to a delayed enable signal END from delay circuit 150 and clock signal P2 to transfer an input signal IN in synchronization with a rising edge and falling edge of clock signal P1, and a latch circuit 154 connected to the output of transfer circuit 152. Latch circuit 154 has a structure of a half latch (weak latch) formed of the inverters as shown in FIG. 19.

Enable signal EN applied to transfer circuit 152 is rendered active in synchronization with a rising edge of clock signal P2.

Figure 22:
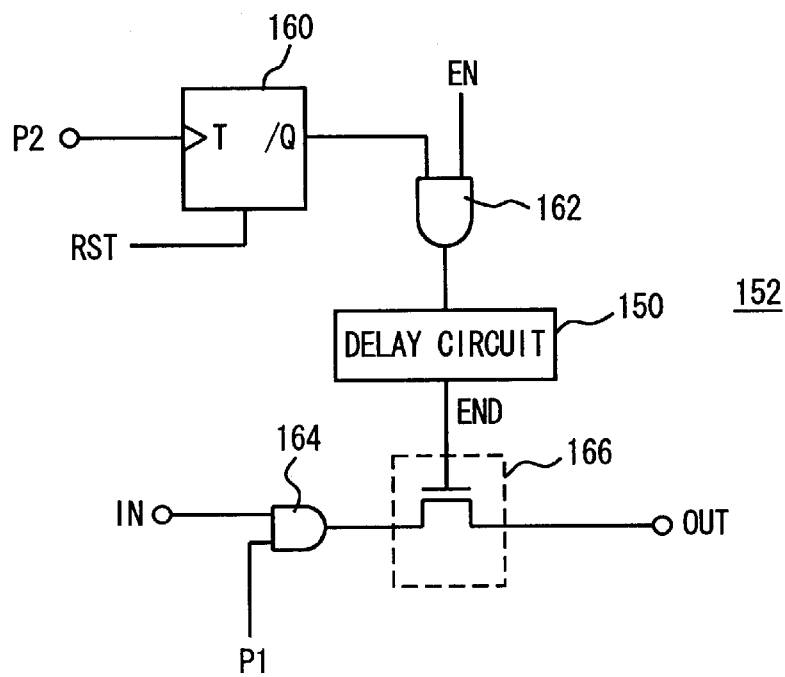
FIG. 22 shows an example of a structure of the transfer circuit of FIG. 21.

FIG. 22 shows an example of a structure of transfer circuit 152 of FIG. 21. Referring to FIG. 22, transfer circuit 152 includes a T flip-flop 160 having its state altered according to clock signal P2, an AND circuit 162 receiving a signal from complementary output /Q of T flip-flop 160 and delayed enable signal EN and applying the output signal to delay circuit 150, an AND circuit 164 receiving clock signal P1 and input signal IN, and a transfer gate 166 rendered conductive, when delayed enable signal END from delay circuit 150 is at an H level, to transmit the output signal of AND circuit 164 to an output terminal OUT. Transfer gate 166 is formed of a transfer gate in FIG. 22. Alternatively, transfer gate 162 may be formed of a CMOS transmission gate or a tristate buffer.

T flip-flop 160 is reset according to a reset signal RST, which in turn is rendered active upon power on or upon system resetting. Therefore, this T flip-flop 160 operates as a divide-by-2 circuit and alters the logic state of the signal from the complementary output/Q in synchronization with the rising edge of clock signal P2.

Figure 23:
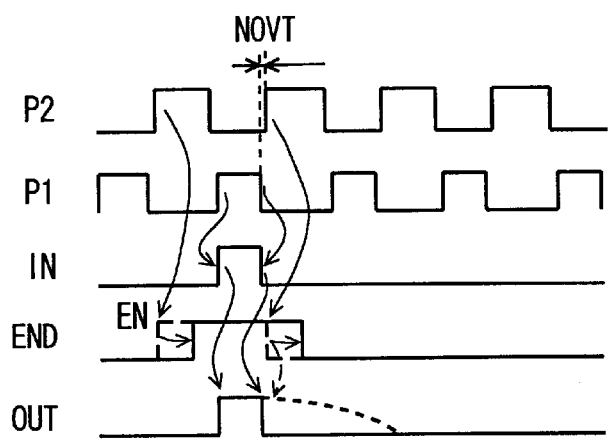
FIG. 23 is a timing chart representing a signal/data transfer operation of the transfer circuit shown in FIGS. 21 and 22.

FIG. 23 is a timing chart representing an operation of the transfer circuit of FIGS. 21 and 22. The operation of the circuit shown in FIGS. 21 and 22 will now be described with reference to FIG. 23.

Enable signal EN is altered in synchronization with a rising edge of clock signal P2. Input signal IN is altered in synchronization with a rising edge of clock signal P1. In FIG. 22, input signal IN is transmitted only during an H level period of clock signal P1.

When clock signal P2 is driven to an H level, enable input signal EN is also pulled up to an H level, whereby the AND circuit 162 delivers an output signal of an H level. Delay circuit 150 delays the output signal of AND circuit 162 by a predetermined time to generate a delayed enable signal END to transfer gate 166. Therefore, delayed enable signal END from delay circuit 150 lags behind clock signal P2 by a predetermined time and attains and is kept at an H level for one dock cycle of clock signal P2, whereby transfer gate 166 is rendered conductive.

Input signal IN is altered in synchronization with a rising edge of clock signal P1. AND circuit 164 applies input signal IN to transfer gate 166 only during an H level period of dock signal P1.

Since the output of AND circuit 164 is at an H level during an H level period of delayed enable signal END, a sufficient time of driving the output signal according to input signal IN is provided. Thus, a sufficient set up time and hold time can be ensured for input signal IN, and the output signal can be driven to a signal level according to input signal IN.

As shown by the broken waveform in FIG. 23, when input signal IN is altered in synchronization with clock signal P2, and the hold time of input signal IN cannot be secured sufficiently with respect to the conductive period of transfer gate 166, signal OUT at the output node would be possibly driven only to an intermediate voltage level into an unstable state. However, the usage of delay circuit 150 allows signal OUT of the output node to be altered to the signal level according to input signal IN reliably.

When non-overlap period NOVT of clock signals P1 and P2 is short when enable input signal EN is pulled down to an L level in synchronization with a rising edge of clock signal P2, the output node of transfer circuit 152 might not be driven sufficiently down to an L level according to a fall of input signal IN, i.e., according to the output signal of AND circuit 164. In this case, the output terminal of transfer circuit 152 cannot be discharged fully, and is held at an intermediate voltage level. In such a case, through current would flow at latch circuit 150 due to the intermediate voltage level.

However, by delaying input enable signal EN by means of delay circuit 150, the output node can be driven fully to an L level at the fall of input signal IN to an L level. Therefore, signal OUT of the output node can be altered according to input signal IN even in the case where non-overlap period NOVT of the two phase clock signals is short.

In the structure shown in FIG. 22, an AND circuit 162 is employed, and input signal IN is transmitted when clock signal P1 is at an H level. However, when input signal IN is altered in synchronization with a rising edge or falling edge of clock signal P1, a gate circuit that is enabled during a L level period of clock signal P1 is provided in parallel to AND circuit 164 to transfer input signal IN to transfer gate 166 via the gate circuit. The gate circuit and AND circuit 164 are OR-wired to the input node of transfer gate 166. Accordingly, input signal IN can be transferred in synchronization with both the rising and falling edges of clock signal P1.

Figure 24:
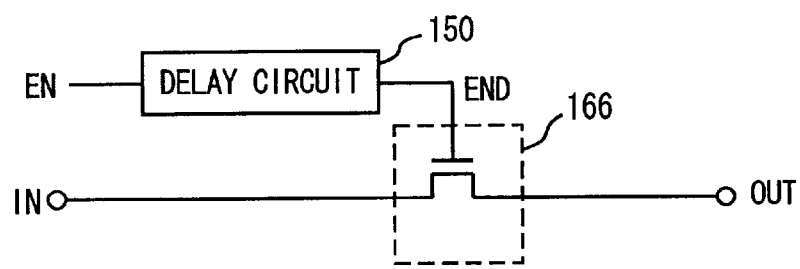
FIG. 24 schematically shows a structure of another modification of the sixth embodiment of the present invention.

In the case where enable input signal EN and input signal IN are altered according to clock signals P2 and P1, respectively, AND circuits 162 and 164 need not be provided, as shown in FIG. 24. Specifically, in delay circuit 150, enable input signal EN is simply delayed and the delayed enable signal END is applied to the control input of transfer gate 166. Transfer circuit 166 receives an input signal that changes in synchronization with both rising and falling edges of clock signal P1 to transfer the input signal when delayed enable signal END is active.

When the transfer signal/data is altered in synchronization with a rising edge and falling edge of clock signal P1 in the structure shown in FIG. 24, i.e., when data is transferred in a double data rate mode, data can easily be transferred at the double data rate.

The problem that a non-selected memory bus receiving transfer data would be driven to an intermediate voltage level at the switching of the memory bus can be prevented even in the case where data is transferred at the double data rate. Specifically, when the fall of enable signal EN is delayed when the memory bus is switched according to a change in enable signal EN, the data/signal to be transferred to the memory bus to be selected next would be transferred for a short period of time to the memory bus that turns into a non-selected state from a selected state. In such a state, the memory bus to be non-selected attains an intermediate voltage level, causing the problem of a through current.

However, with a delayed enable signal END, the signal/data to be transferred to a memory bus next can be transferred to the memory bus to be non-selected over a relatively long period of time. Therefore, such an intermediate voltage problem will not occur.

Delayed enable signal END shown in FIG. 23 has sufficiently long set up and hold times with respect to both edges of clock signal P1. An input signal IN altered in synchronization with both edges of clock signal P1 can be correctly transferred according to enable signal EN that is altered in synchronization with one edge of clock signal P2.

In the case where the logic level of input signal IN is fixed during one clock cycle of clock signal P1 in the structure of transfer circuit 152 shown in FIG. 22, it is sufficient to apply clock signal P1 to AND circuit 164 via a T flip-flop. A sufficient hold time for input signal IN can be ensured, and a signal corresponding to input signal IN can be correctly transferred to the output node. Therefore, the problem of the output node being held at an intermediate voltage level can be prevented.

According to the present sixth embodiment, in the case of a structure of a transfer circuit that is first turned into an enable state and then is supplied with an input signal, the enabling signal is delayed by a predetermined time and therefore, the output node can be properly driven according to the input signal. The output node can be prevented from being held at an intermediate potential. Therefore, the consumed current can be reduced.

In the structure shown in FIGS. 17 to 18, a data/signal transfer path from internal bus 34 to memory buses 39 and 36 is shown. In the case where memory buses 36 and 39 are each a bidirectional bus, a similar structure has only to be arranged at the transfer path from a memory bus to the internal bus.

According to the present invention, the semiconductor chip region is divided into an internal circuitry region and a pad outside region, and a memory is arranged at the pad outside region. Therefore, the increase/decrease of the memory capacity of the memory can be easily accommodated for. The labor in layout modification can be reduced. Also, the time required for testing can be reduced.

When the transfer circuit enters an enable state prior to receipt of an input signal, the output node can be reliably driven according to the input signal by delaying the enable signal by a predetermined time. The problem of the output node being driven to an intermediate potential level can be prevented, and the consumed current can be reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device comprising:
   a first semiconductor region having internal circuitry arranged thereon, said internal circuitry including a processing unit;
   a second semiconductor region having a first memory unit arranged thereon, said first memory unit storing data used at least by said processing unit; and
   pads arranged between the first and second semiconductor regions.

2. The semiconductor integrated circuit device according to claim 1, wherein said pads are arranged surrounding said first semiconductor region.

3. The semiconductor integrated circuit device according to claim 1, wherein said second semiconductor region includes
   a first sub semiconductor region arranged opposite to said first semiconductor region with respect to said pads, and
   a second sub semiconductor region arranged opposite to said first semiconductor region with respect to said pads, the first and second sub semiconductor regions being arranged opposite to each other with respect to said first semiconductor region.

4. The semiconductor integrated circuit device according to claim 1, further comprising:
   a second memory unit arranged in said first semiconductor region;
   a memory select signal generation circuit for generating a memory select signal specifying one of the first and second memory units according to a memory address signal from said processing unit; and
   a memory select circuit for electrically coupling one of the first and second memory units with said processing unit according to a memory select signal from said memory select signal generation circuit.

5. The semiconductor integrated circuit device according to claim 4, wherein said pads are arranged in a same arrangement pattern at a same pitch independently of a memory capacity of the first and second memory units.

6. The semiconductor integrated circuit device according to claim 1, wherein said first memory unit comprises a plurality of memory circuits of a common type alternatively accessed by said processing unit.

7. The semiconductor integrated circuit device according to claim 1, wherein said internal circuitry arranged in said first semiconductor region has a fixed circuit layout independently of a memory capacity of said first memory unit.

8. The semiconductor integrated circuit device according to claim 1, further comprising:
   a second memory unit arranged in said first semiconductor region;
   a first bus coupled to said first memory unit;
   a second bus coupled to said second memory unit; and
   a bus select circuit for connecting the first and second buses to a third bus selectively and electrically according to a memory address signal from said processing unit,
   said processing unit including a bus interface unit coupled to said third bus.

9. The semiconductor integrated circuit device according to claim 1, wherein said first memory unit comprises a plurality of blocks, and
   said semiconductor integrated circuit device further comprises:

a second memory unit arranged on said first semiconductor region, and having a plurality of blocks; and a block decode circuit for generating a memory block select signal selecting a block of the first and second memory units according to a memory address signal from said processing unit, said memory select signal including a memory select signal specifying one of said first and second memory units, and a block select signal selecting a block;

a plurality of first buses arranged corresponding to the plurality of blocks of said first memory unit, respectively;

a plurality of second buses arranged corresponding to the plurality of blocks of said second memory unit, respectively; and a select circuit for coupling a bus arranged for a selected memory to said processing unit via a bus interface unit according to said memory select signal.

10. The semiconductor integrated circuit device according to claim 9, wherein said select circuit comprises a first selector responsive to said memory select signal, for electrically connecting a first bus arranged for a selected block of said first memory unit to a third bus, a second selector for connecting a second bus arranged for a selected block of said second memory unit to a fourth bus according to said memory select signal, and a third selector for electrically coupling one of the third and fourth buses to a fifth bus according to said memory select signal, said fifth bus being electrically connected to said processing unit via said bus interface unit.

11. The semiconductor integrated circuit device according to claim 1, further comprising:

a second memory unit arranged on said first semiconductor region;

a decode circuit for generating a memory select signal specifying one of the first and second memory units according to a memory address signal from said processing unit; and a select circuit enabled according to a first clock signal, for transmitting data received from said processing unit according to a second clock signal complementary to said first clock signal, to one of the first and second memory units according to said memory select signal, said select circuit being enabled according to said first clock signal before the data from said processing unit is made definite.

12. The semiconductor integrated circuit device according to claim 1, further comprising:

a second memory unit arranged on said first semiconductor region;

a decode circuit for generating a memory select signal specifying one of the first and second memory units according to a memory address signal from said processing unit; and a select circuit for electrically coupling one of said first and second memory units to said processing unit according to said memory select signal, said memory select signal being made valid according to a first clock signal, and data transmitted by said select circuit turning into a valid state in synchronization with a second clock signal complementary to said first clock signal.

13. The semiconductor integrated circuit device according to claim 1, further comprising:

a second memory unit arranged on said first semiconductor region;

a select signal generation circuit for generating a memory select signal specifying one of the first and second memory units according to a memory address signal from said processing unit and transmitting the memory select signal in synchronization with a first clock signal;

a select circuit for coupling one of said first and second memory units to an internal bus according to said memory select signal; and a transfer circuit for transferring data from said processing unit to said select circuit via said internal bus in synchronization with a second clock signal complementary to said first clock signal.

14. The semiconductor integrated circuit device according to claim 13, wherein the first and second clock signals are two phase, non-overlapping clock signals, and said memory select signal and said data turn definite in synchronization with first edges of the first and second clock signals, respectively.

* * * * *